(12) United States Patent
Zhao et al.

(10) Patent No.: US 11,201,111 B2
(45) Date of Patent: Dec. 14, 2021

(54) THREE-DIMENSIONAL MEMORY DEVICE CONTAINING STRUCTURES FOR ENHANCING GATE-INDUCED DRAIN LEAKAGE CURRENT AND METHODS OF FORMING THE SAME

(71) Applicant: SANDISK TECHNOLOGIES LLC, Addison, TX (US)

(72) Inventors: Dengtao Zhao, Milpitas, CA (US); Zhiping Zhang, Milpitas, CA (US); Peng Zhang, Fremont, CA (US); Deepanshu Dutta, Fremont, CA (US)

(73) Assignee: SANDISK TECHNOLOGIES LLC, Addison, TX (US)

( * ) Notice: Subject to any disclaimer, the term of this patent is extended or adjusted under 35 U.S.C. 154(b) by 9 days.

(21) Appl. No.: 16/697,560

(22) Filed: Nov. 27, 2019

(65) Prior Publication Data
US 2021/0159169 A1 May 27, 2021

(51) Int. Cl.
*H01L 27/11578* (2017.01)
*H01L 23/522* (2006.01)
(Continued)

(52) U.S. Cl.
CPC .......... *H01L 23/5226* (2013.01); *G11C 5/063* (2013.01); *G11C 16/16* (2013.01);
(Continued)

(58) Field of Classification Search
CPC ..................................... H01L 27/11578–11582
See application file for complete search history.

(56) References Cited

U.S. PATENT DOCUMENTS 5,915,167 A 6/1999 Leedy
9,985,098 B2 5/2018 Matsumoto et al.
(Continued)

OTHER PUBLICATIONS

Chen, J. et al., "The Enhancement of Gate-Induced-Drain-Leakage (LIDL) Current in Short-Channel SOI MOSEFET and Its Application in Measuring Lateral Bipolar Current Gain β," IEEE Electron Letters, vol. 13, No. 11, pp. 572-574, (1992).

(Continued)

*Primary Examiner* — Christopher A Johnson
(74) *Attorney, Agent, or Firm* — The Marbury Law Group PLLC

(57) ABSTRACT

A three-dimensional memory device includes an alternating stack of insulating layers and electrically conductive layers located over a substrate, where the electrically conductive layers comprise word lines located between a source select gate electrode and a drain select gate electrode, a memory opening vertically extending through each layer of the alternating stack to a top surface of the substrate, a memory film and vertical semiconductor channel having a doping of a first conductivity type located in the memory opening, and an active region having a doping of a second conductivity type that is an opposite of the first conductivity type and adjoined to an end portion of the vertical semiconductor channel to provide a p-n junction. The end portion of the vertical semiconductor channel has a first thickness, and a middle portion of the vertical semiconductor channel has a second thickness which is less than the first thickness.

4 Claims, 30 Drawing Sheets

(51) Int. Cl.
    *H01L 23/528*      (2006.01)
    *G11C 5/06*      (2006.01)
    *G11C 16/16*      (2006.01)
    *H01L 27/11582*      (2017.01)
    *H01L 27/11524*      (2017.01)
    *H01L 27/11556*      (2017.01)
    *H01L 27/11565*      (2017.01)
    *H01L 27/1157*      (2017.01)
    *H01L 27/11519*      (2017.01)

(52) U.S. Cl.
    CPC ...... *H01L 23/5283* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(56) References Cited

U.S. PATENT DOCUMENTS

| | | | |
|---|---|---|---|
| 10,008,570 | B2 | 6/2018 | Yu et al. |
| 10,020,363 | B2 | 7/2018 | Ogawa et al. |
| 2018/0122904 | A1 | 5/2018 | Matsumoto et al. |
| 2018/0122905 | A1 | 5/2018 | Ogawa et al. |
| 2018/0122906 | A1 | 5/2018 | Yu et al. |
| 2019/0067025 | A1* | 2/2019 | Yada .................. H01L 23/5283 |
| 2019/0267391 | A1* | 8/2019 | Imai .................. G11C 16/0466 |
| 2019/0333581 | A1 | 10/2019 | Diep et al. |

OTHER PUBLICATIONS

Endoh, T. et al., "Novel Ultra High Density Memory with a Stacked-Surrounding Gate Transistor (S-SGT) Structured Cell," IEDM Proc., (2001), 33-36.

Choi, Y.K et al., "Investigation of Gate-Induced Leakage (GIDL) Current in Thin Body Devices: Single-Gate Ultra-Thin Body, Symmetrical Double-Gate, and Asymmetrical Double-Gate MOSFETs," Jpn. J. Appl. Phys., vol. 42, Part 1, No. 4B, pp. 2073-2076, (2003).

U.S. Appl. No. 16/196,026, filed Nov. 20, 2018, SanDisk Technologies LLC.

U.S. Appl. No. 16/579,974, filed Sep. 24, 2019, SanDisk Technologies LLC.

* cited by examiner

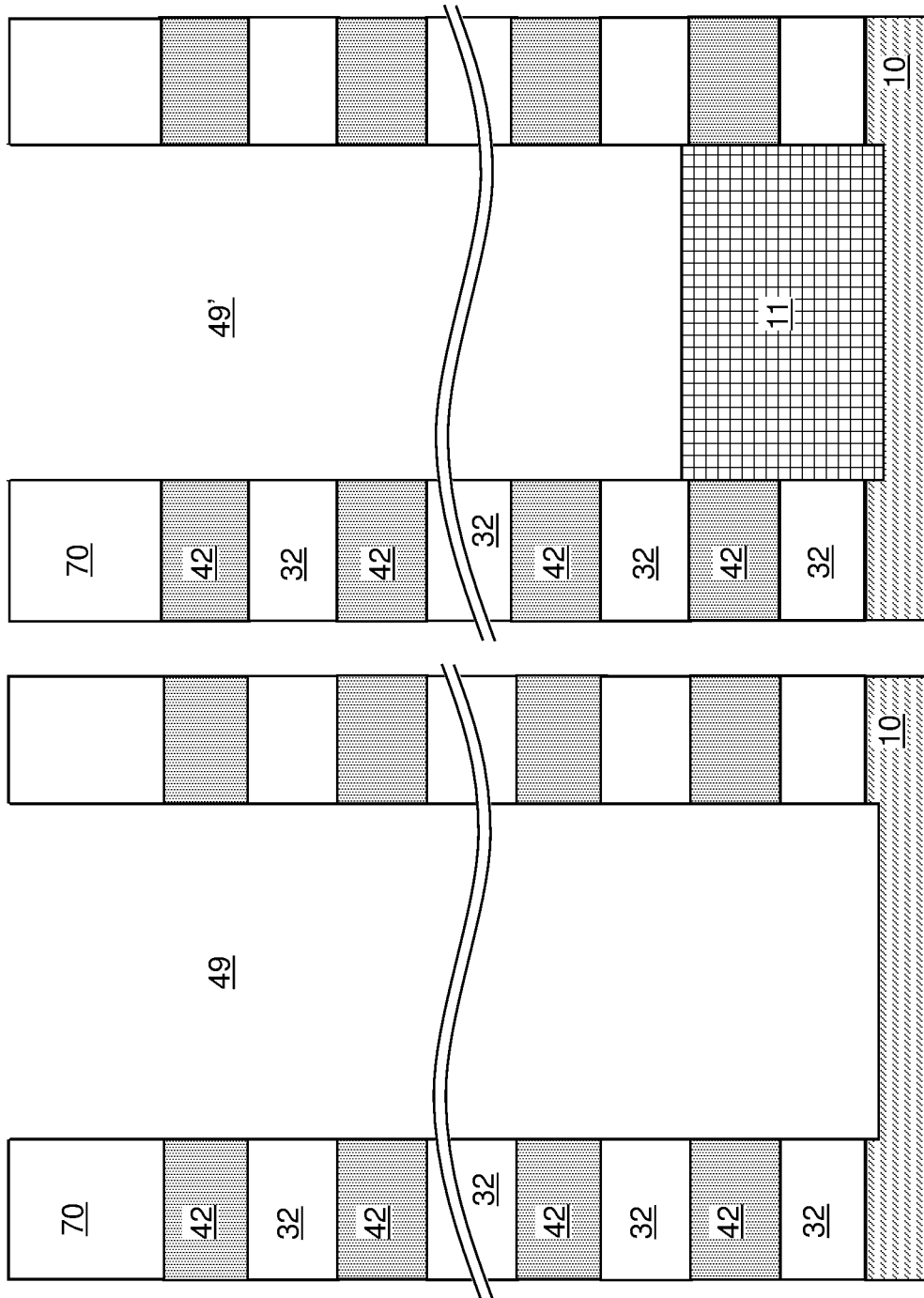

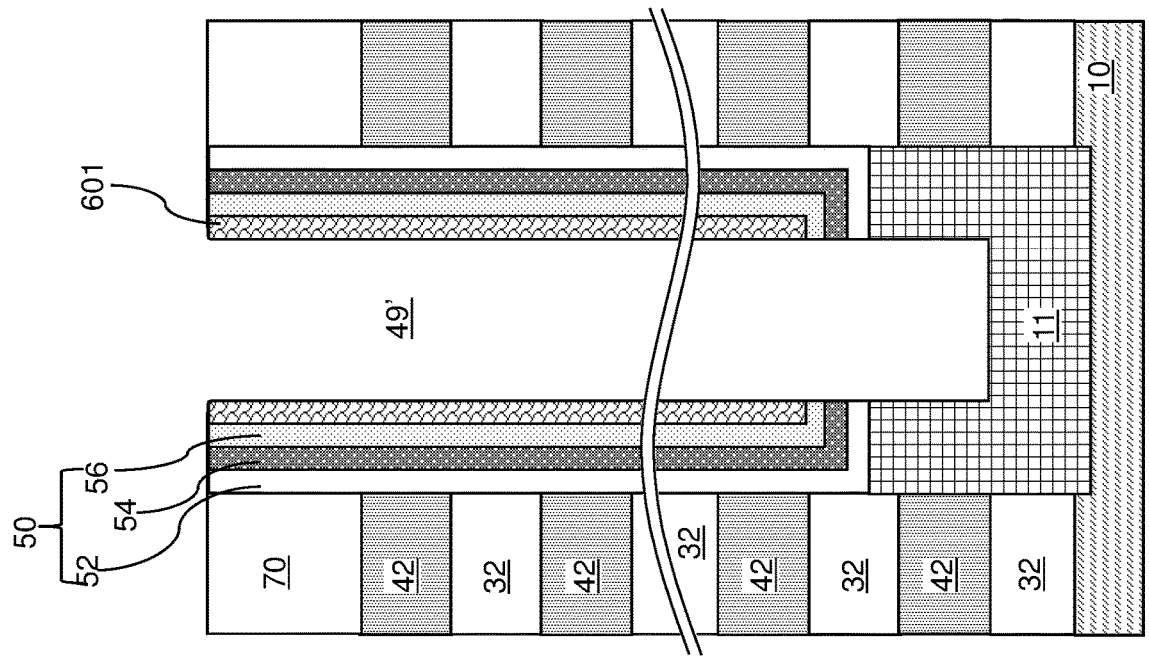
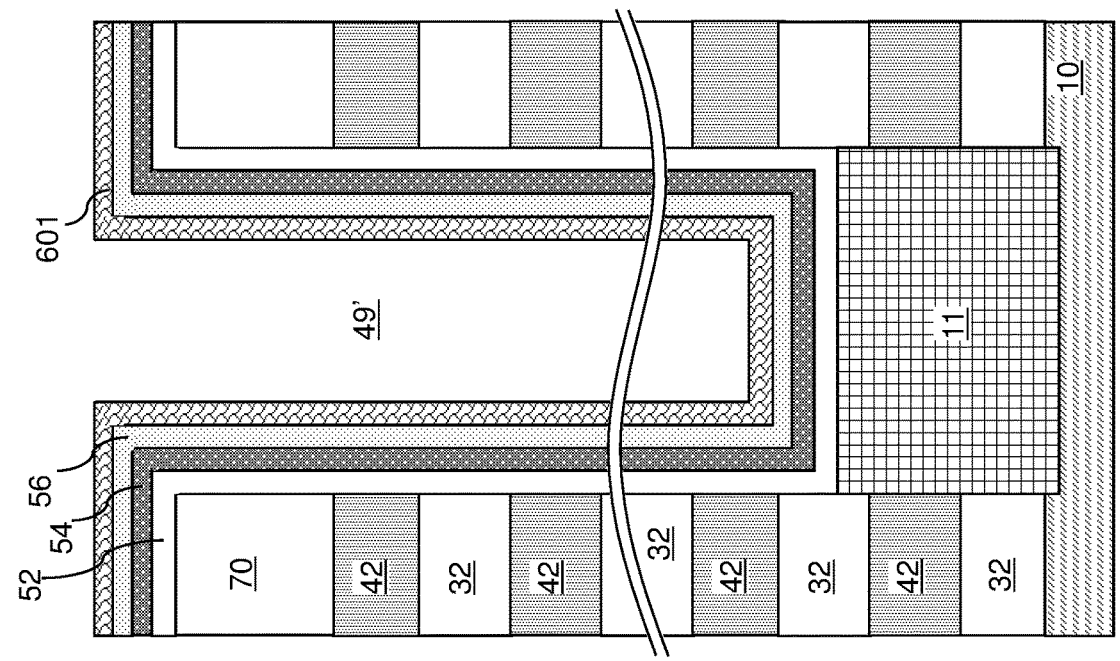

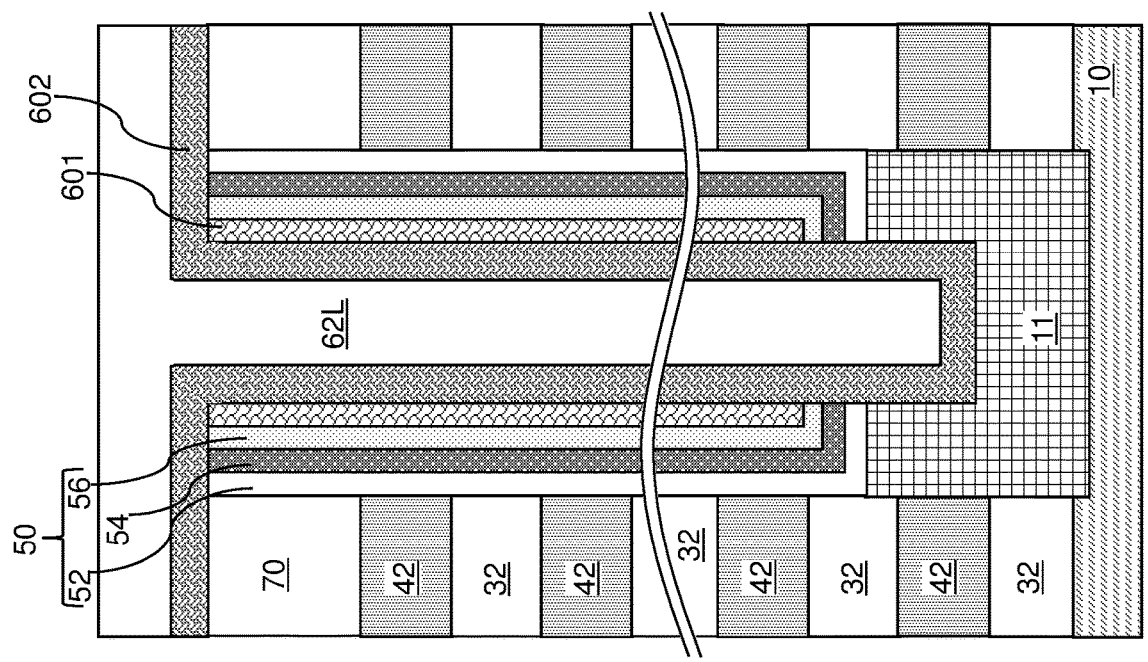
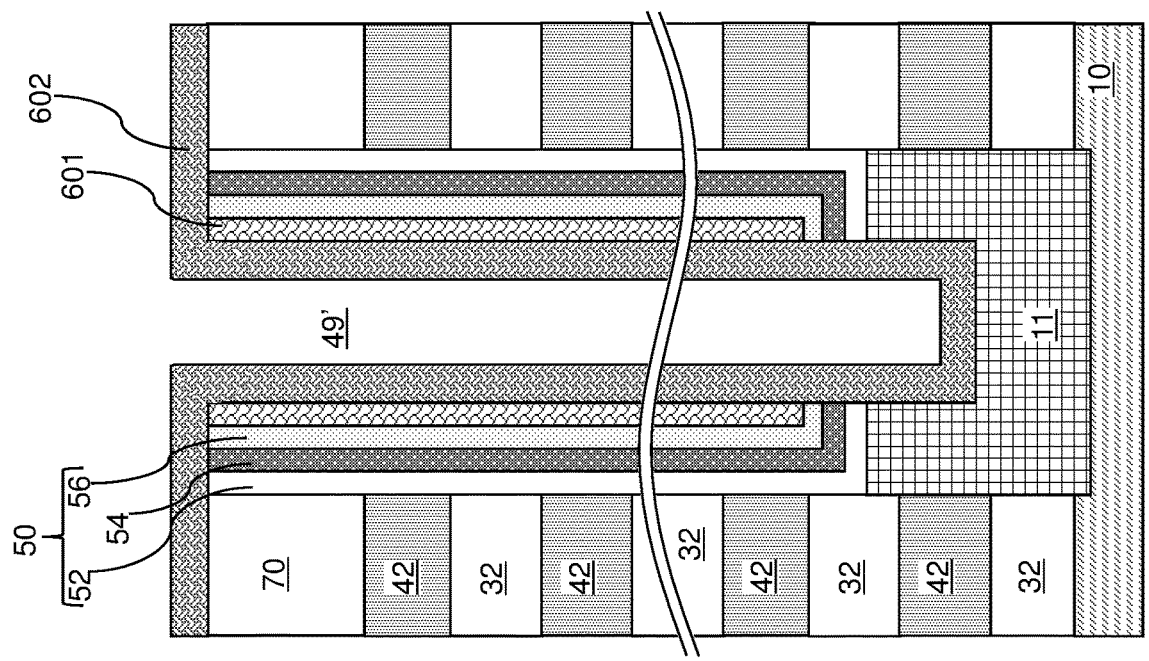

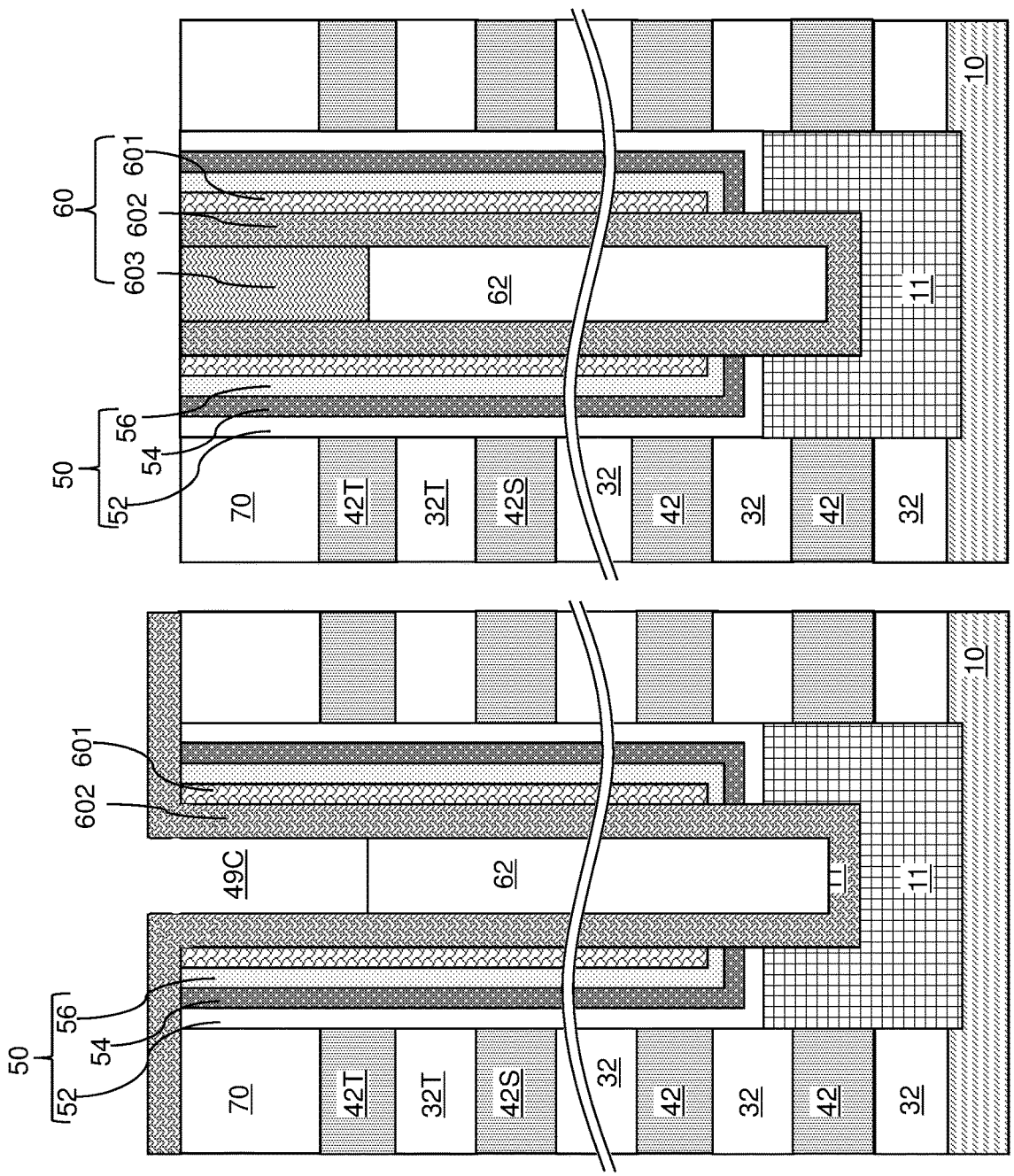

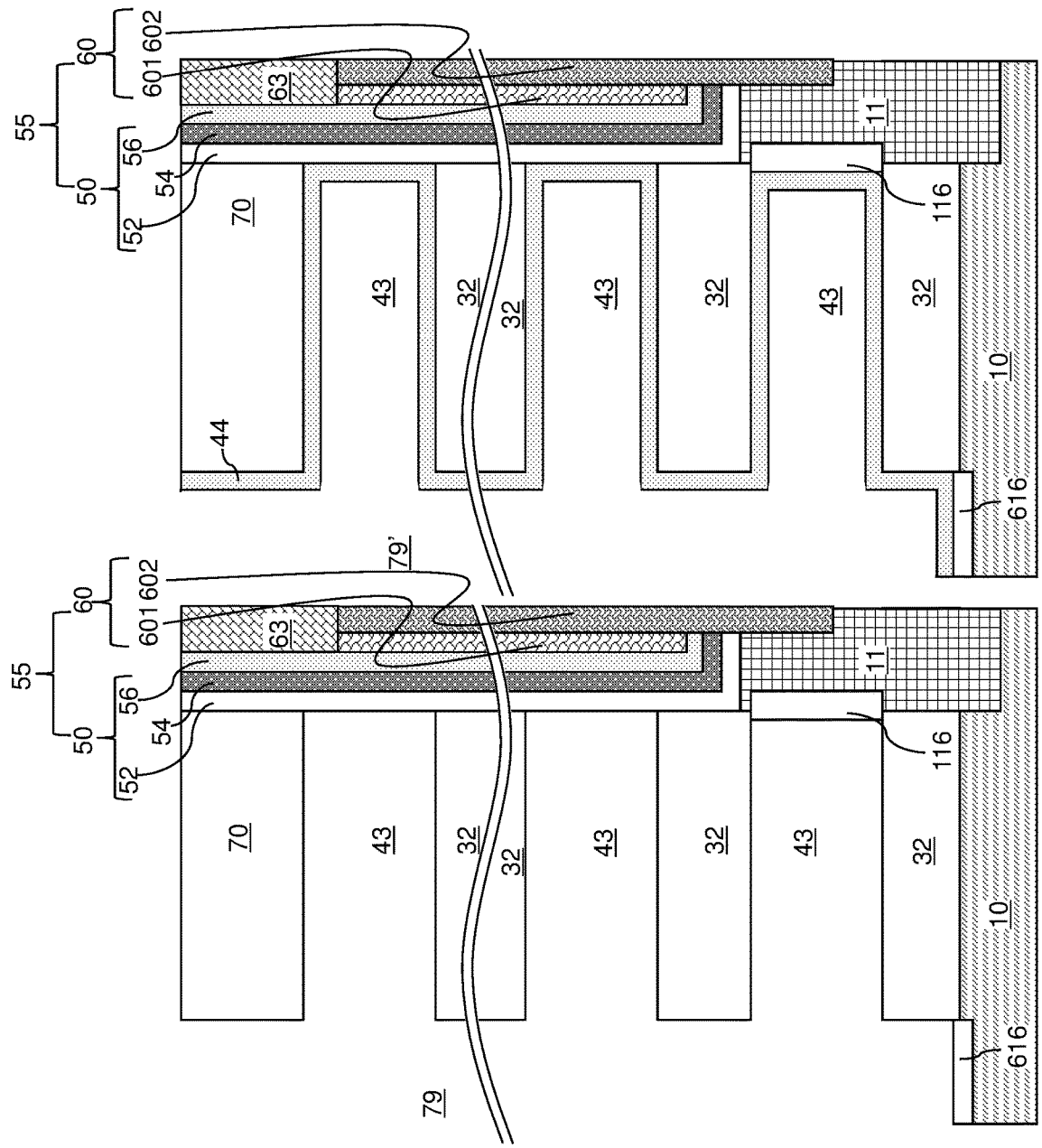

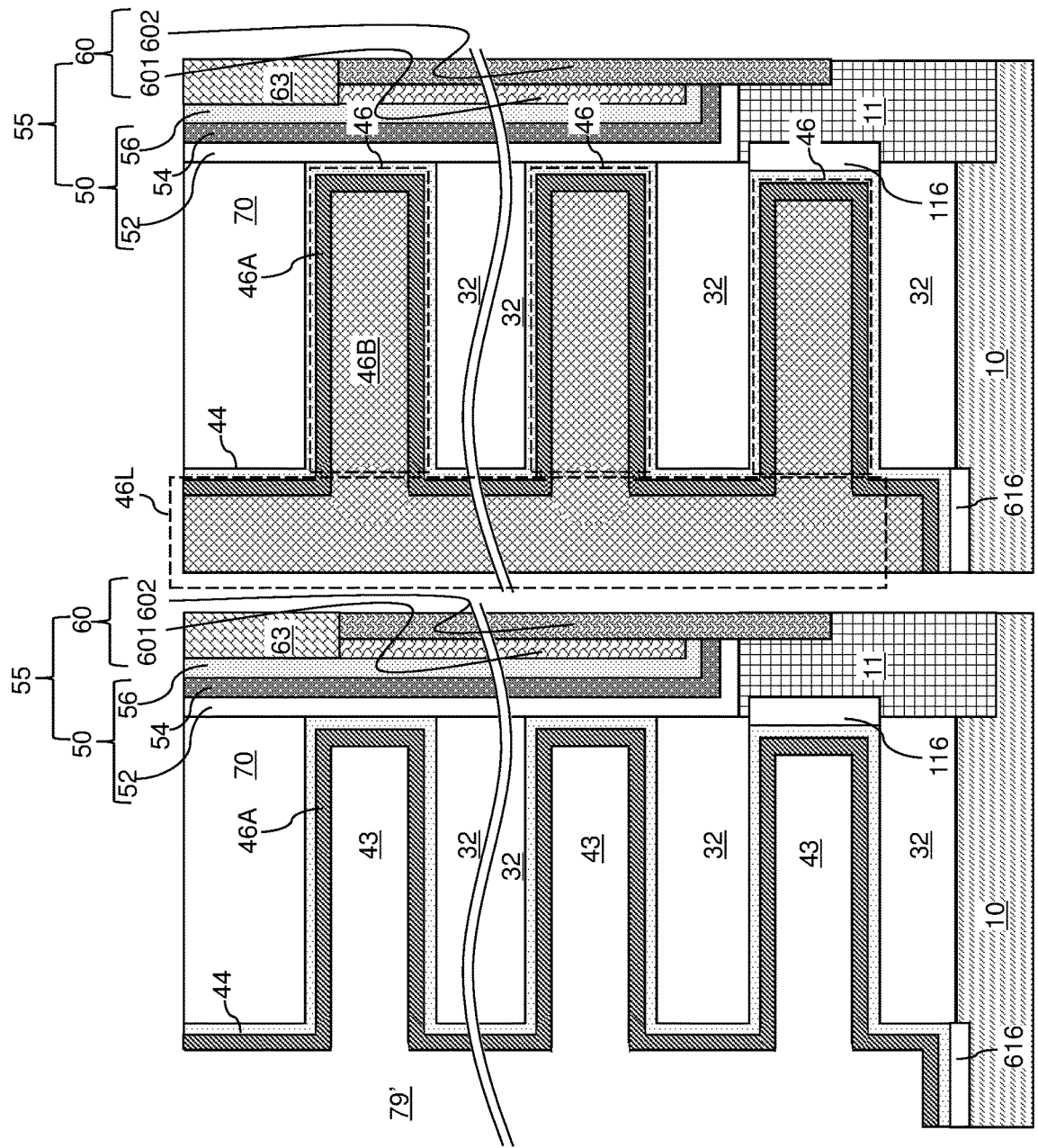

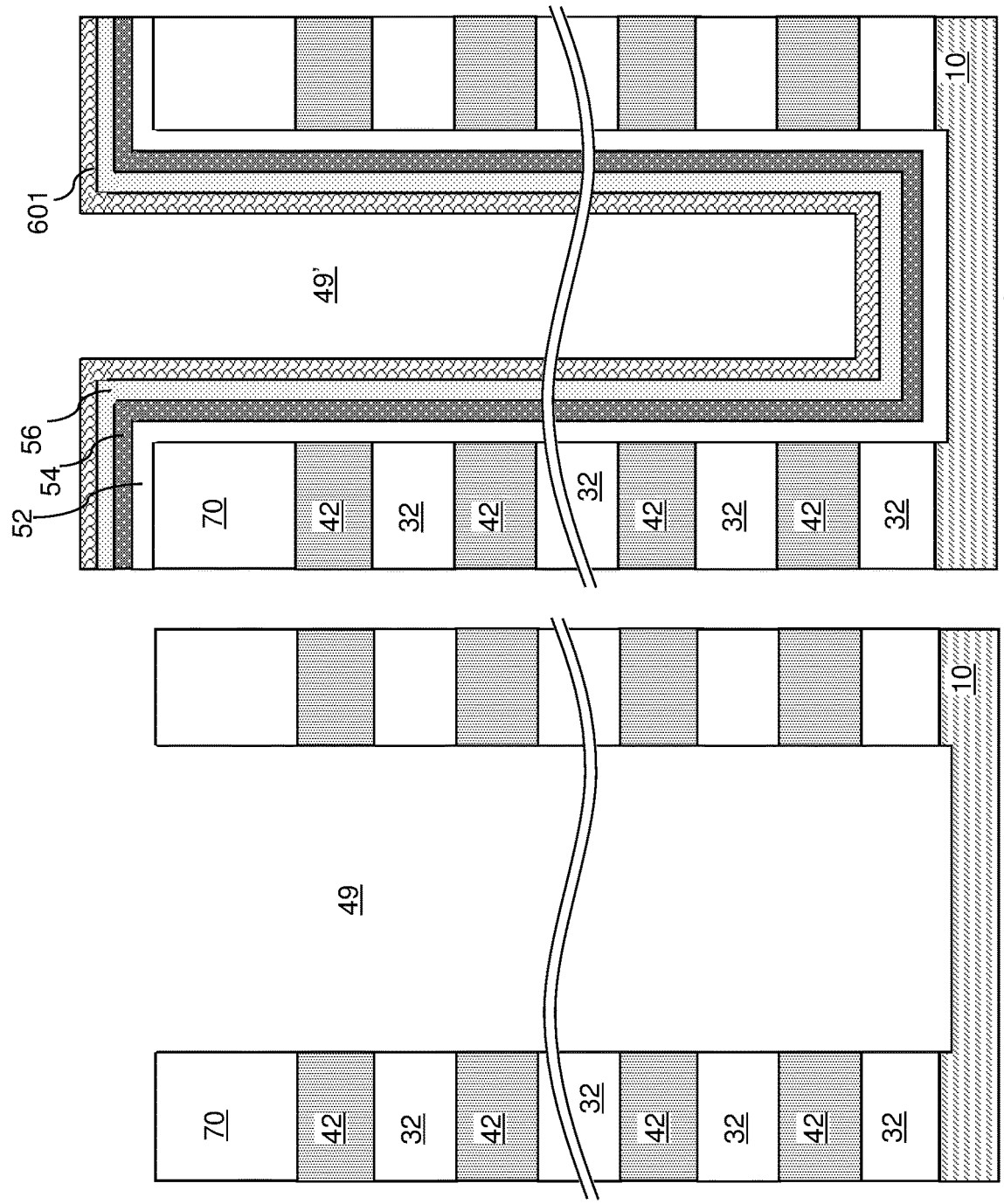

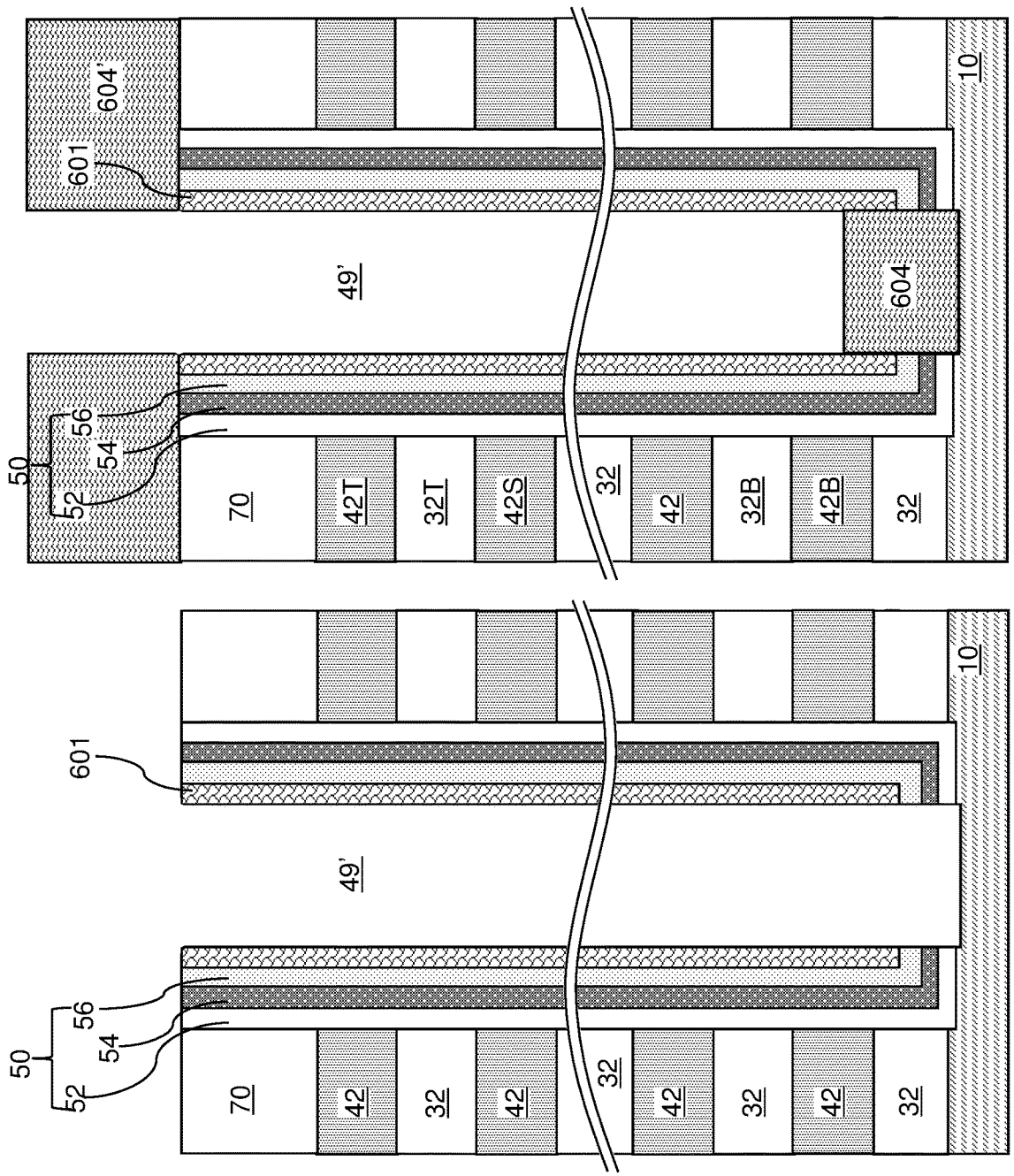

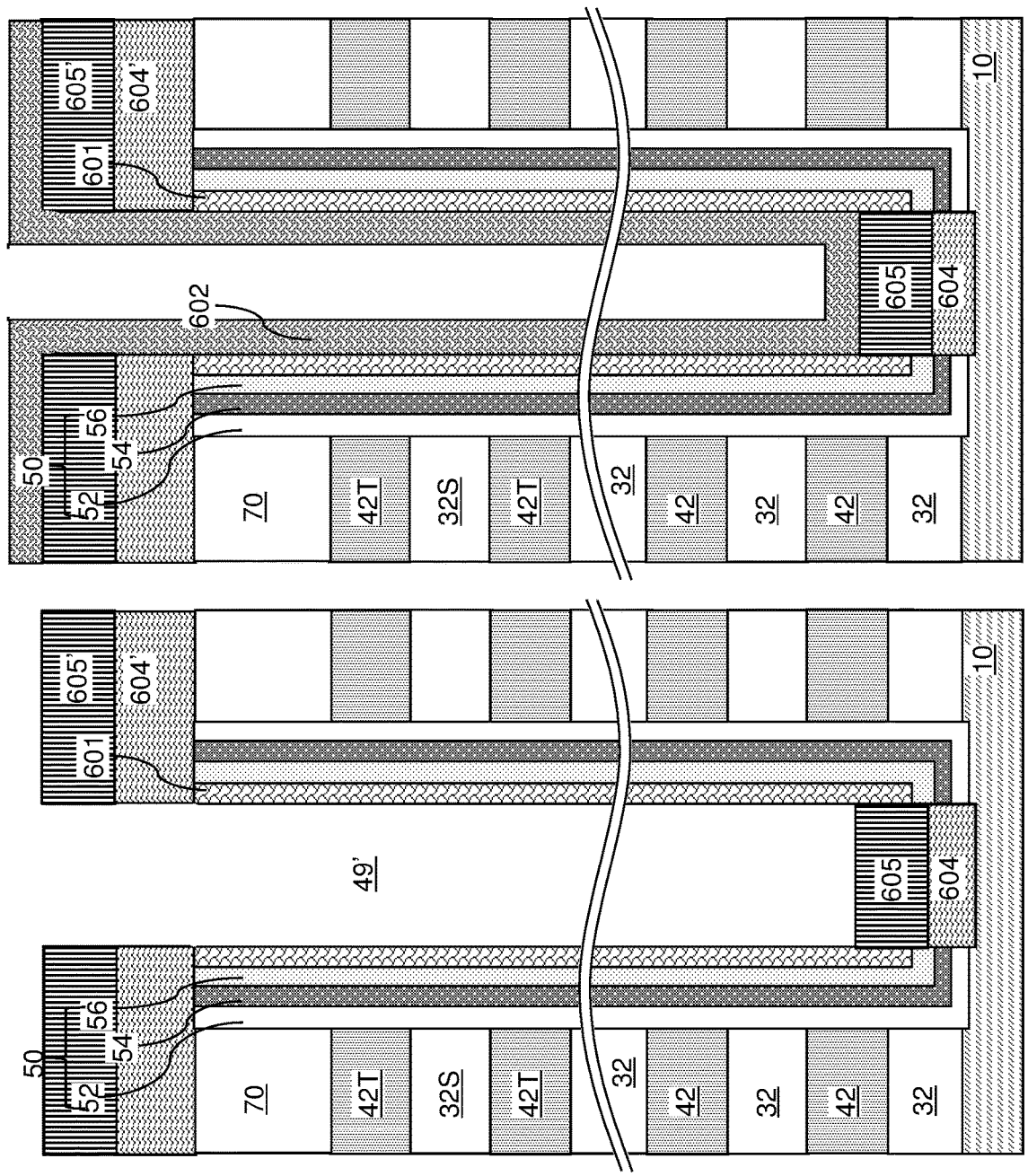

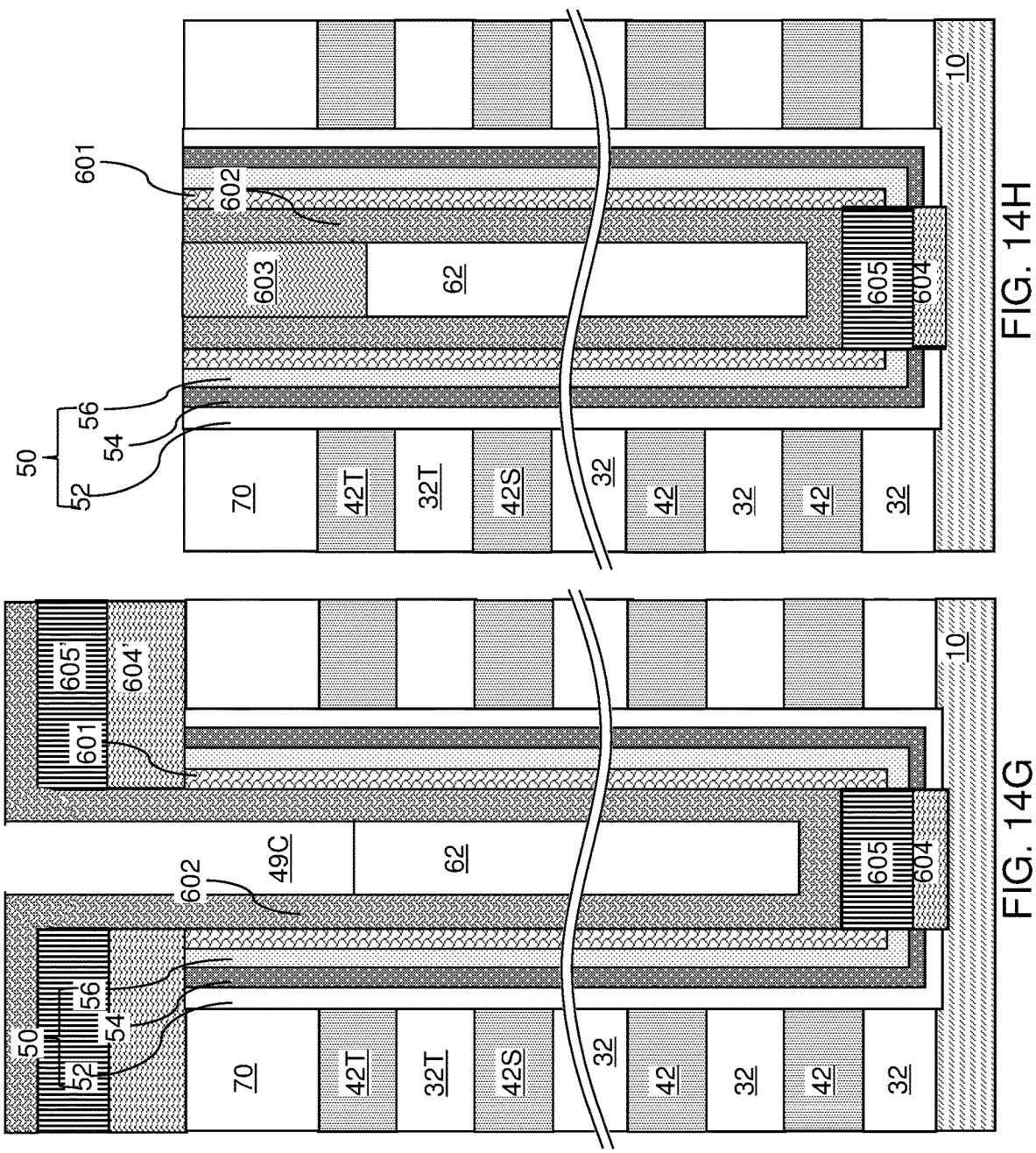

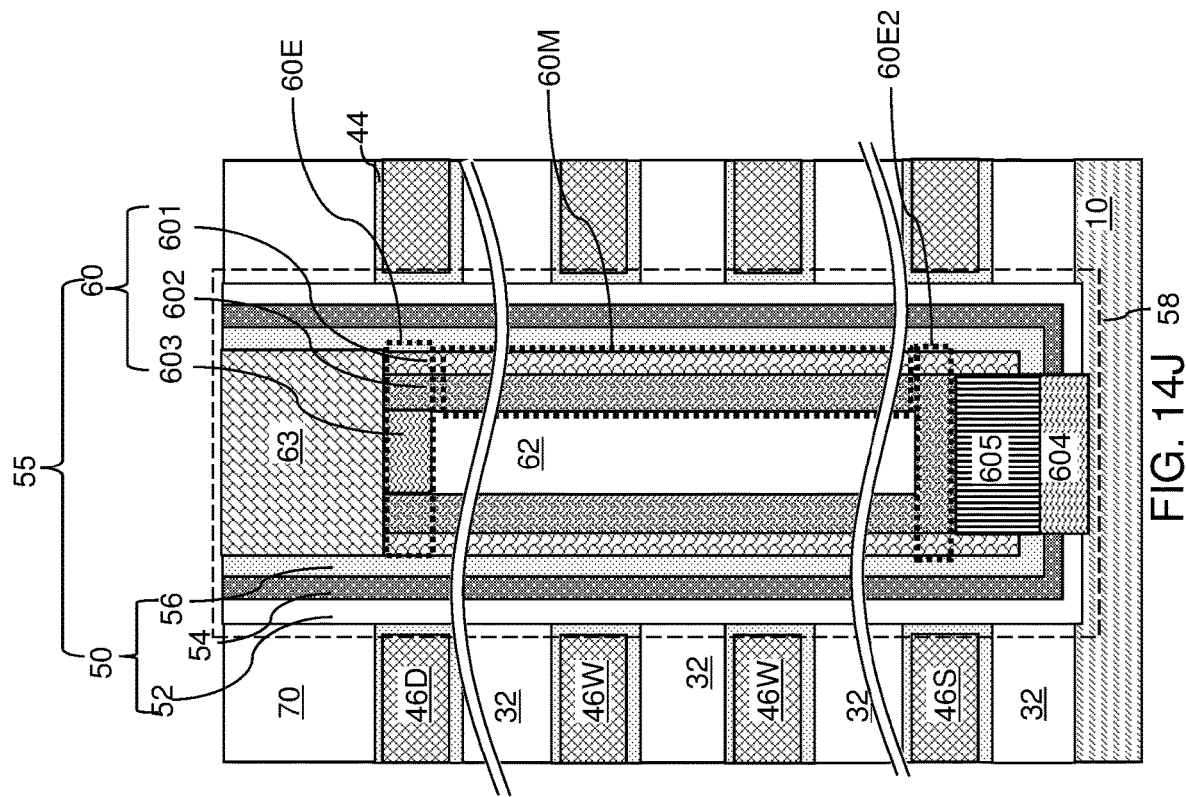
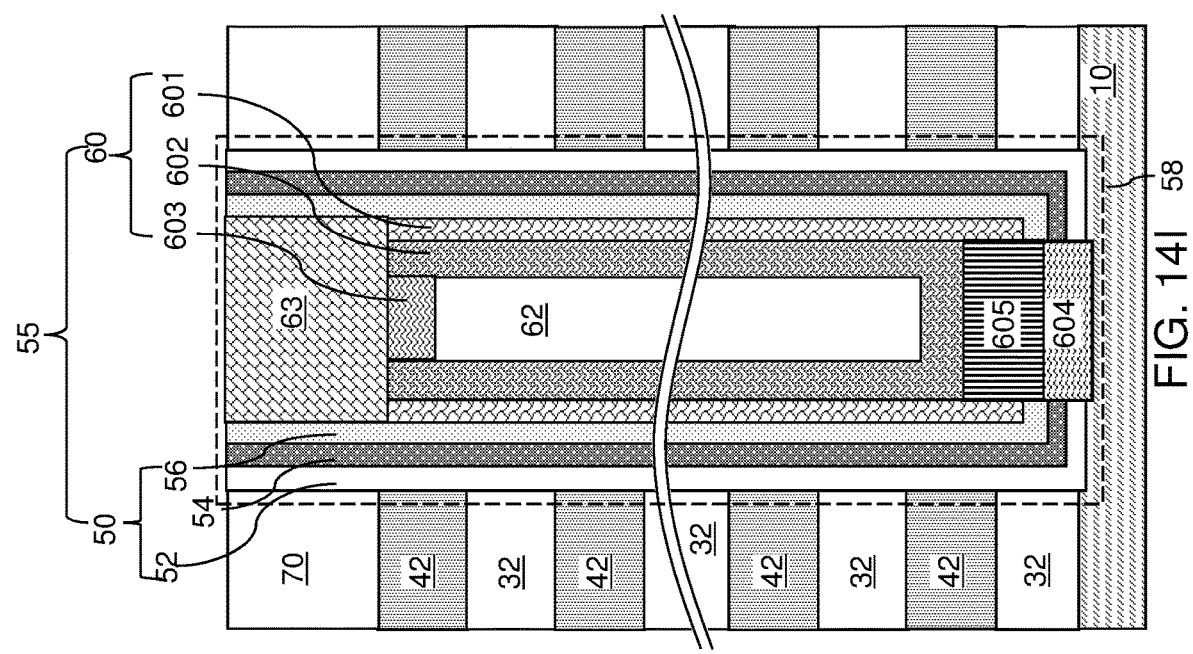

THREE-DIMENSIONAL MEMORY DEVICE CONTAINING STRUCTURES FOR ENHANCING GATE-INDUCED DRAIN LEAKAGE CURRENT AND METHODS OF FORMING THE SAME

FIELD

The present disclosure relates generally to the field of semiconductor devices, and particularly to a three-dimensional memory device including structures for enhancing gate-induced drain leakage current for high speed erase operations and methods of manufacturing the same.

BACKGROUND

Three-dimensional vertical NAND strings having one bit per cell are disclosed in an article by T. Endoh et al., titled "Novel Ultra High Density Memory With A Stacked-Surrounding Gate Transistor (S-SGT) Structured Cell", IEDM Proc. (2001) 33-36.

SUMMARY

According to an aspect of the present disclosure, a three-dimensional memory device is provided, which comprises: an alternating stack of insulating layers and electrically conductive layers located over a substrate, wherein the electrically conductive layers comprise word lines located between a source select gate electrode and a drain select gate electrode; a memory opening vertically extending through each layer of the alternating stack to a top surface of the substrate; a memory film and a vertical semiconductor channel having a doping of a first conductivity type located in the memory opening; and an active region having a doping of a second conductivity type that is an opposite of the first conductivity type and adjoined to an end portion of the vertical semiconductor channel to provide a p-n junction, wherein the end portion of the vertical semiconductor channel has a first thickness, and a middle portion of the vertical semiconductor channel has a second thickness which is less than the first thickness.

According to another aspect of the present disclosure, a method of forming a three-dimensional memory device is provided, which comprises the steps of: forming an alternating stack of insulating layers and spacer material layers over a substrate, wherein the spacer material layers are formed as, or are subsequently replaced with, electrically conductive layers which comprise word lines located between a source select gate electrode and a drain select gate electrode; forming a memory opening vertically extending through each layer of the alternating stack to a top surface of the substrate; forming a memory film at a periphery of the memory opening; and forming a combination of a vertical semiconductor channel and an active region inside the memory film, wherein the vertical semiconductor channel has a doping of a first conductivity type, and the active region has a doping of a second conductivity type that is an opposite of the first conductivity type, and wherein the active region is adjoined to an end portion of the vertical semiconductor channel to provide a p-n junction, and the end portion of the vertical semiconductor channel has a first thickness, and a middle portion of the vertical semiconductor channel has a second thickness which is less than the first thickness.

BRIEF DESCRIPTION OF THE DRAWINGS

FIGS. 5A-5I are sequential schematic vertical cross-sectional views of a memory opening within the first exemplary structure during formation of a first exemplary memory opening fill structure according to the first embodiment of the present disclosure.

FIGS. 9A-9D are sequential vertical cross-sectional views of a region of the first exemplary structure during formation of electrically conductive layers according to the first embodiment of the present disclosure.

FIGS. 14A-14J are sequential schematic vertical cross-sectional views of a memory opening within a second exemplary structure during formation of a second exemplary memory opening fill structure according to a second embodiment of the present disclosure.

DETAILED DESCRIPTION

Figure 1:
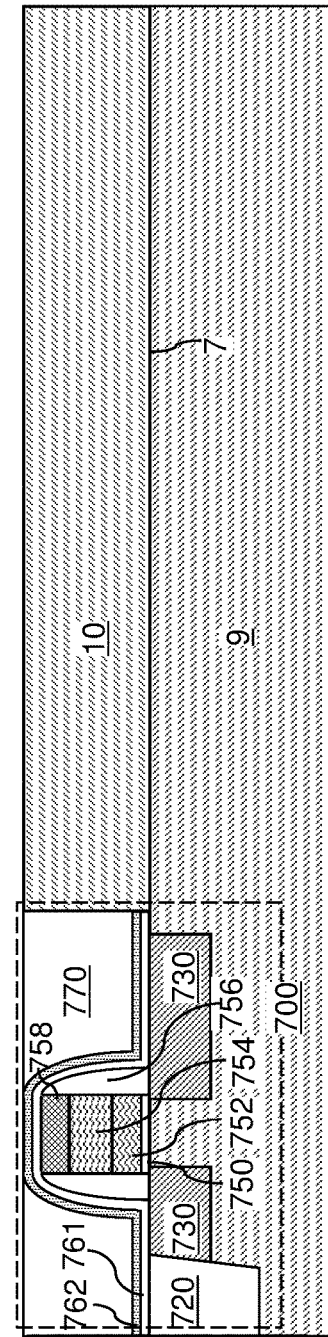
FIG. 1 is a schematic vertical cross-sectional view of a first exemplary structure after formation of at least one peripheral device and a semiconductor material layer according to a first embodiment of the present disclosure.

Gate-induced drain leakage ("GIDL") current can be employed to perform erase operations for vertical NAND strings. A sufficiently high GIDL current is desired for a high speed erase operation. As discussed above, the embodiments of the present disclosure are directed to a three-dimensional memory device including structures for enhancing gate-induced drain leakage current for high speed erase operations, the various aspects of which are described below. The embodiments of the disclosure can be employed to form various structures including three-dimensional monolithic memory array devices comprising a plurality of NAND memory strings.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming A page is also the smallest unit that can be selected to a read operation.

Referring to FIG. 1, a first exemplary structure according to a first embodiment of the present disclosure is illustrated, which can be employed, for example, to fabricate a device structure containing vertical NAND memory devices. The first exemplary structure includes a substrate (9, 10), which can be a semiconductor substrate. The substrate can include a substrate semiconductor layer 9 and an optional semiconductor material layer 10. The substrate semiconductor layer 9 maybe a semiconductor wafer or a semiconductor material layer, and can include at least one elemental semiconductor material (e.g., single crystal silicon wafer or layer), at least one III-V compound semiconductor material, at least one II-VI compound semiconductor material, at least one organic semiconductor material, or other semiconductor materials known in the art. The substrate can have a major surface 7, which can be, for example, a topmost surface of the substrate semiconductor layer 9. The major surface 7 can be a semiconductor surface. In one embodiment, the major surface 7 can be a single crystalline semiconductor surface, such as a single crystalline semiconductor surface.

As used herein, a "semiconducting material" refers to a material having electrical conductivity in the range from $1.0\times10^{-5}$ S/m to $1.0\times10^5$ S/m. As used herein, a "semiconductor material" refers to a material having electrical conductivity in the range from $1.0\times10^{-5}$ S/m to 1.0 S/m in the absence of electrical dopants therein, and is capable of producing a doped material having electrical conductivity in a range from 1.0 S/m to $1.0\times10^5$ S/m upon suitable doping with an electrical dopant. As used herein, an "electrical dopant" refers to a p-type dopant that adds a hole to a valence band within a band structure, or an n-type dopant that adds an electron to a conduction band within a band structure. As used herein, a "conductive material" refers to a material having electrical conductivity greater than $1.0\times10^5$ S/m. As used herein, an "insulator material" or a "dielectric material" refers to a material having electrical conductivity less than $1.0\times10^{-5}$ S/m. As used herein, a "heavily doped semiconductor material" refers to a semiconductor material that is doped with electrical dopant at a sufficiently high atomic concentration to become a conductive material either as formed as a crystalline material or if converted into a crystalline material through an anneal process (for example, from an initial amorphous state), i.e., to have electrical conductivity greater than $1.0\times10^5$ S/m. A "doped semiconductor material" may be a heavily doped semiconductor material, or may be a semiconductor material that includes electrical dopants (i.e., p-type dopants and/or n-type dopants) at a concentration that provides electrical conductivity in the range from $1.0\times10^{-5}$ S/m to $1.0\times10^5$ S/m. An "intrinsic semiconductor material" refers to a semiconductor material that is not doped with electrical dopants. Thus, a semiconductor material may be semiconducting or conductive, and may be an intrinsic semiconductor material or a doped semiconductor material. A doped semiconductor material can be semiconducting or conductive depending on the atomic concentration of electrical dopants therein. As used herein, a "metallic material" refers to a conductive material including at least one metallic element therein. All measurements for electrical conductivities are made at the standard condition.

At least one semiconductor device 700 for a peripheral circuitry can be formed on a portion of the substrate semiconductor layer 9. The at least one semiconductor device can include, for example, field effect transistors. For example, at least one shallow trench isolation structure 720 can be formed by etching portions of the substrate semiconductor layer 9 and depositing a dielectric material therein. A gate dielectric layer, at least one gate conductor layer, and a gate cap dielectric layer can be formed over the substrate semiconductor layer 9, and can be subsequently patterned to form at least one gate structure 750, each of which can include a gate dielectric 752, a gate electrode 754, and a gate cap dielectric 758. At least one gate spacer 756 can be formed around the at least one gate structure 750 by depositing and anisotropically etching a dielectric liner. Active regions 730 can be formed in upper regions of the substrate semiconductor layer 9, for example, by introducing electrical dopants employing the at least one gate structure 750 as masking structures. Additional masks may be employed as needed. The active region 730 can include source regions and drain regions of field effect transistors. A first dielectric liner 761 and a second dielectric liner 762 can be optionally formed. Each of the first and second dielectric liners (761, 762) can comprise a silicon oxide layer, a silicon nitride layer, and/or a dielectric metal oxide layer. As used herein, silicon oxide includes silicon dioxide as well as non-stoichiometric silicon oxides having more or less than two oxygen atoms for each silicon atoms. Silicon dioxide is preferred. In an illustrative example, the first dielectric liner 761 can be a silicon oxide layer, and the second dielectric liner 762 can be a silicon nitride layer. The least one semiconductor device for the peripheral circuitry can contain a driver circuit for memory devices to be subsequently formed, which can include at least one NAND device.

A dielectric material such as silicon oxide can be deposited over the at least one semiconductor device, and can be subsequently planarized to form a planarization dielectric layer 770. In one embodiment the planarized top surface of the planarization dielectric layer 770 can be coplanar with a top surface of the dielectric liners (761, 762). Subsequently, the planarization dielectric layer 770 and the dielectric liners (761, 762) can be removed from an area to physically expose a top surface of the substrate semiconductor layer 9. As used herein, a surface is "physically exposed" if the surface is in physical contact with vacuum, or a gas phase material (such as air).

The optional semiconductor material layer 10, if present, can be formed on the top surface of the substrate semiconductor layer 9 prior to, or after, formation of the at least one semiconductor device 700 by deposition of a single crystalline semiconductor material, for example, by selective epitaxy. The deposited semiconductor material can be the same as, or can be different from, the semiconductor material of the substrate semiconductor layer 9. The deposited semiconductor material can be any material that can be employed for the substrate semiconductor layer 9 as described above. The single crystalline semiconductor material of the semiconductor material layer 10 can be in epitaxial alignment with the single crystalline structure of the substrate semiconductor layer 9. Portions of the deposited semiconductor material located above the top surface of the planarization dielectric layer 770 can be removed, for example, by chemical mechanical planarization (CMP). In this case, the semiconductor material layer 10 can have a top surface that is coplanar with the top surface of the planarization dielectric layer 770.

The region (i.e., area) of the at least one semiconductor device 700 is herein referred to as a peripheral device region 200. The region in which a memory array is subsequently formed is herein referred to as a memory array region 100. A staircase region 300 for subsequently forming stepped terraces of electrically conductive layers can be provided between the memory array region 100 and the peripheral device region 200. In another embodiment illustrated in FIG. 16 and described in more detail below, the at least one semiconductor device 700 (e.g., at least one CMOS device of the driver circuit) may be formed under the memory array region 100 rather than next to the memory array region 100.

Figure 2:
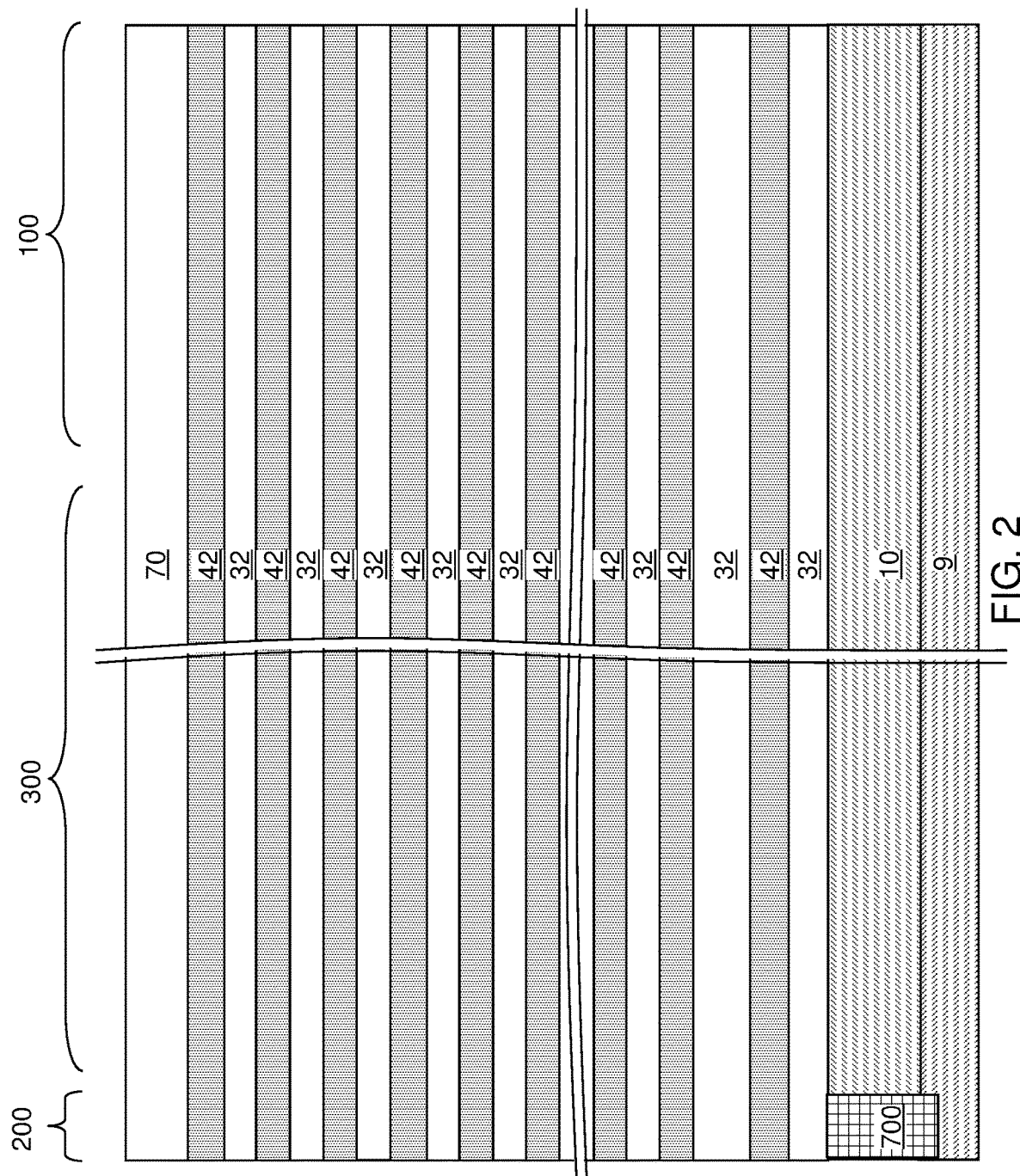
FIG. 2 is a schematic vertical cross-sectional view of the first exemplary structure after formation of an alternating stack of insulating layers and sacrificial material layers according to the first embodiment of the present disclosure.

Referring to FIG. 2, a stack of an alternating plurality of first material layers (which can be insulating layers 32) and second material layers (which can be sacrificial material layer 42) is formed over the top surface of the substrate (9, 10). As used herein, a "material layer" refers to a layer including a material throughout the entirety thereof. As used herein, an alternating plurality of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness thereamongst, or may have different thicknesses. The second elements may have the same thickness thereamongst, or may have different thicknesses. The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

Each first material layer includes a first material, and each second material layer includes a second material that is different from the first material. In one embodiment, each first material layer can be an insulating layer 32, and each second material layer can be a sacrificial material layer. In this case, the stack can include an alternating plurality of insulating layers 32 and sacrificial material layers 42, and constitutes a prototype stack of alternating layers comprising insulating layers 32 and sacrificial material layers 42.

The stack of the alternating plurality is herein referred to as an alternating stack (32, 42). In one embodiment, the alternating stack (32, 42) can include insulating layers 32 composed of the first material, and sacrificial material layers 42 composed of a second material different from that of insulating layers 32. The first material of the insulating layers 32 can be at least one insulating material. As such, each insulating layer 32 can be an insulating material layer. Insulating materials that can be employed for the insulating layers 32 include, but are not limited to, silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the insulating layers 32 can be silicon oxide.

The second material of the sacrificial material layers 42 is a sacrificial material that can be removed selective to the first material of the insulating layers 32. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The sacrificial material layers 42 may comprise an insulating material, a semiconductor material, or a conductive material. The second material of the sacrificial material layers 42 can be subsequently replaced with electrically conductive electrodes which can function, for example, as control gate electrodes of a vertical NAND device. Non-limiting examples of the second material include silicon nitride, an amorphous semiconductor material (such as amorphous silicon), and a polycrystalline semiconductor material (such as polysilicon). In one embodiment, the sacrificial material layers 42 can be spacer material layers that comprise silicon nitride or a semiconductor material including at least one of silicon and germanium.

In one embodiment, the insulating layers 32 can include silicon oxide, and sacrificial material layers can include silicon nitride sacrificial material layers. The first material of the insulating layers 32 can be deposited, for example, by chemical vapor deposition (CVD). For example, if silicon oxide is employed for the insulating layers 32, tetraethyl orthosilicate (TEOS) can be employed as the precursor material for the CVD process. The second material of the sacrificial material layers 42 can be formed, for example, CVD or atomic layer deposition (ALD).

The sacrificial material layers 42 can be suitably patterned so that conductive material portions to be subsequently formed by replacement of the sacrificial material layers 42 can function as electrically conductive electrodes, such as the control gate electrodes of the monolithic three-dimensional NAND string memory devices to be subsequently formed. The sacrificial material layers 42 may comprise a portion having a strip shape extending substantially parallel to the major surface 7 of the substrate.

The thicknesses of the insulating layers 32 and the sacrificial material layers 42 can be in a range from 20 nm to 50 nm, although lesser and greater thicknesses can be employed for each insulating layer 32 and for each sacrificial material layer 42. The number of repetitions of the pairs of an insulating layer 32 and a sacrificial material layer (e.g., a control gate electrode or a sacrificial material layer) 42 can be in a range from 2 to 1,024, and typically from 8 to 256, although a greater number of repetitions can also be employed. The top and bottom gate electrodes in the stack may function as the select gate electrodes. In one embodiment, each sacrificial material layer 42 in the alternating stack (32, 42) can have a uniform thickness that is substantially invariant within each respective sacrificial material layer 42.

While the present disclosure is described employing an embodiment in which the spacer material layers are sacrificial material layers 42 that are subsequently replaced with electrically conductive layers, embodiments are expressly contemplated herein in which the sacrificial material layers are formed as electrically conductive layers. In this case, steps for replacing the spacer material layers with electrically conductive layers can be omitted.

Optionally, an insulating cap layer 70 can be formed over the alternating stack (32, 42). The insulating cap layer 70 includes a dielectric material that is different from the material of the sacrificial material layers 42. In one embodiment, the insulating cap layer 70 can include a dielectric material that can be employed for the insulating layers 32 as described above. The insulating cap layer 70 can have a greater thickness than each of the insulating layers 32. The insulating cap layer 70 can be deposited, for example, by chemical vapor deposition. In one embodiment, the insulating cap layer 70 can be a silicon oxide layer.

Figure 3:
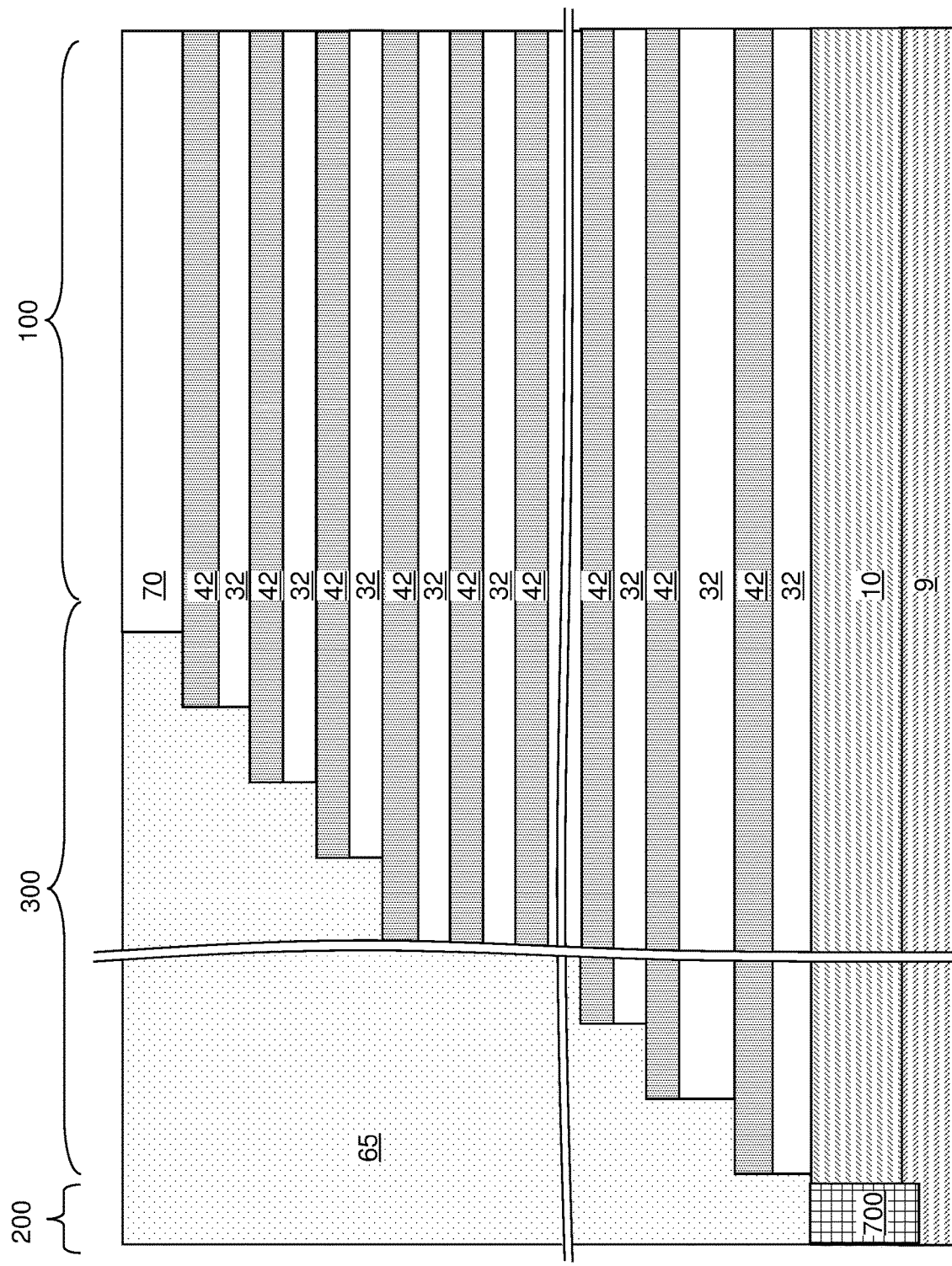
FIG. 3 is a schematic vertical cross-sectional view of the first exemplary structure after formation of stepped terraces and a retro-stepped dielectric material portion according to the first embodiment of the present disclosure.

Referring to FIG. 3, stepped surfaces are formed at a peripheral region of the alternating stack (32, 42), which is herein referred to as a terrace region. As used herein, "stepped surfaces" refer to a set of surfaces that include at least two horizontal surfaces and at least two vertical surfaces such that each horizontal surface is adjoined to a first vertical surface that extends upward from a first edge of the horizontal surface, and is adjoined to a second vertical surface that extends downward from a second edge of the horizontal surface. A stepped cavity is formed within the volume from which portions of the alternating stack (32, 42) are removed through formation of the stepped surfaces. A "stepped cavity" refers to a cavity having stepped surfaces.

The terrace region is formed in the staircase region 300, which is located between the memory array region 100 and the peripheral device region 200 containing the at least one semiconductor device for the peripheral circuitry. The stepped cavity can have various stepped surfaces such that the horizontal cross-sectional shape of the stepped cavity changes in steps as a function of the vertical distance from the top surface of the substrate (9, 10). In one embodiment, the stepped cavity can be formed by repetitively performing a set of processing steps. The set of processing steps can include, for example, an etch process of a first type that vertically increases the depth of a cavity by one or more levels, and an etch process of a second type that laterally expands the area to be vertically etched in a subsequent etch process of the first type. As used herein, a "level" of a structure including alternating plurality is defined as the relative position of a pair of a first material layer and a second material layer within the structure.

Each sacrificial material layer 42 other than a topmost sacrificial material layer 42 within the alternating stack (32, 42) laterally extends farther than any overlying sacrificial material layer 42 within the alternating stack (32, 42) in the terrace region. The terrace region includes stepped surfaces of the alternating stack (32, 42) that continuously extend from a bottommost layer within the alternating stack (32, 42) to a topmost layer within the alternating stack (32, 42).

Each vertical step of the stepped surfaces can have the height of one or more pairs of an insulating layer 32 and a sacrificial material layer. In one embodiment, each vertical step can have the height of a single pair of an insulating layer 32 and a sacrificial material layer 42. In another embodiment, multiple "columns" of staircases can be formed along a first horizontal direction hd1 such that each vertical step has the height of a plurality of pairs of an insulating layer 32 and a sacrificial material layer 42, and the number of columns can be at least the number of the plurality of pairs. Each column of staircase can be vertically offset among one another such that each of the sacrificial material layers 42 has a physically exposed top surface in a respective column of staircases. In the illustrative example, two columns of staircases are formed for each block of memory stack structures to be subsequently formed such that one column of staircases provide physically exposed top surfaces for odd-numbered sacrificial material layers 42 (as counted from the bottom) and another column of staircases provide physically exposed top surfaces for even-numbered sacrificial material layers (as counted from the bottom). Configurations employing three, four, or more columns of staircases with a respective set of vertical offsets among the physically exposed surfaces of the sacrificial material layers 42 may also be employed. Each sacrificial material layer 42 has a greater lateral extent, at least along one direction, than any overlying sacrificial material layers 42 such that each physically exposed surface of any sacrificial material layer 42 does not have an overhang. In one embodiment, the vertical steps within each column of staircases may be arranged along the first horizontal direction hd1, and the columns of staircases may be arranged along a second horizontal direction hd2 that is perpendicular to the first horizontal direction hd1. In one embodiment, the first horizontal direction hd1 may be perpendicular to the boundary between the memory array region 100 and the staircase region 300.

A retro-stepped dielectric material portion 65 (i.e., an insulating fill material portion) can be formed in the stepped cavity by deposition of a dielectric material therein. For example, a dielectric material such as silicon oxide can be deposited in the stepped cavity. Excess portions of the deposited dielectric material can be removed from above the top surface of the insulating cap layer 70, for example, by chemical mechanical planarization (CMP). The remaining portion of the deposited dielectric material filling the stepped cavity constitutes the retro-stepped dielectric material portion 65. As used herein, a "retro-stepped" element refers to an element that has stepped surfaces and a horizontal cross-sectional area that increases monotonically as a function of a vertical distance from a top surface of a substrate on which the element is present. If silicon oxide is employed for the retro-stepped dielectric material portion 65, the silicon oxide of the retro-stepped dielectric material portion 65 may, or may not, be doped with dopants such as B, P, and/or F.

Optionally, drain select level isolation structures 72 can be formed through the insulating cap layer 70 and a subset of the sacrificial material layers 42 located at drain select levels. The drain select level isolation structures 72 can be formed, for example, by forming drain select level isolation trenches and filling the drain select level isolation trenches with a dielectric material such as silicon oxide. Excess portions of the dielectric material can be removed from above the top surface of the insulating cap layer 70.

Figure 4A:
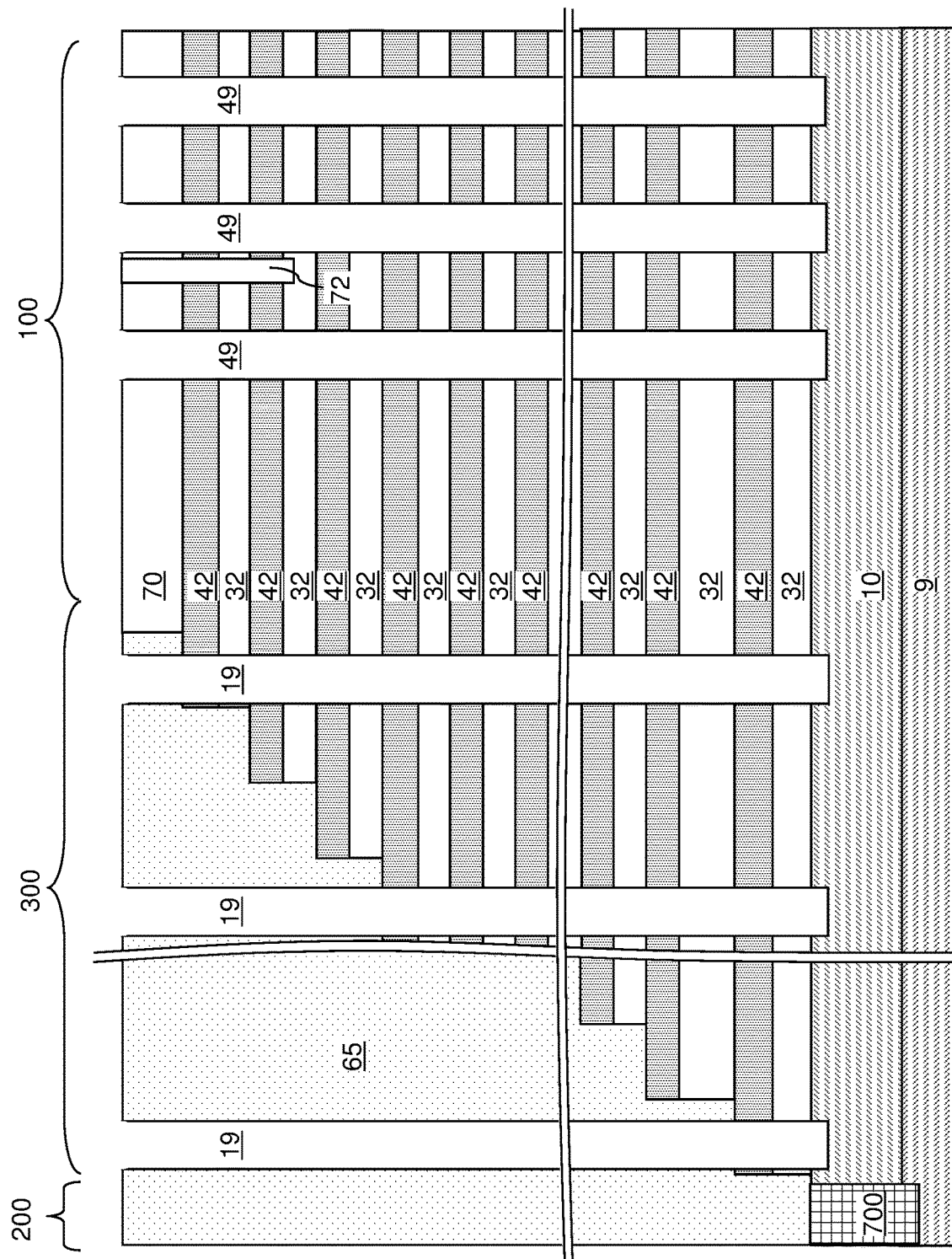
FIG. 4A is a schematic vertical cross-sectional view of the first exemplary structure after formation of memory openings and support openings according to the first embodiment of the present disclosure.
Figure 4B:
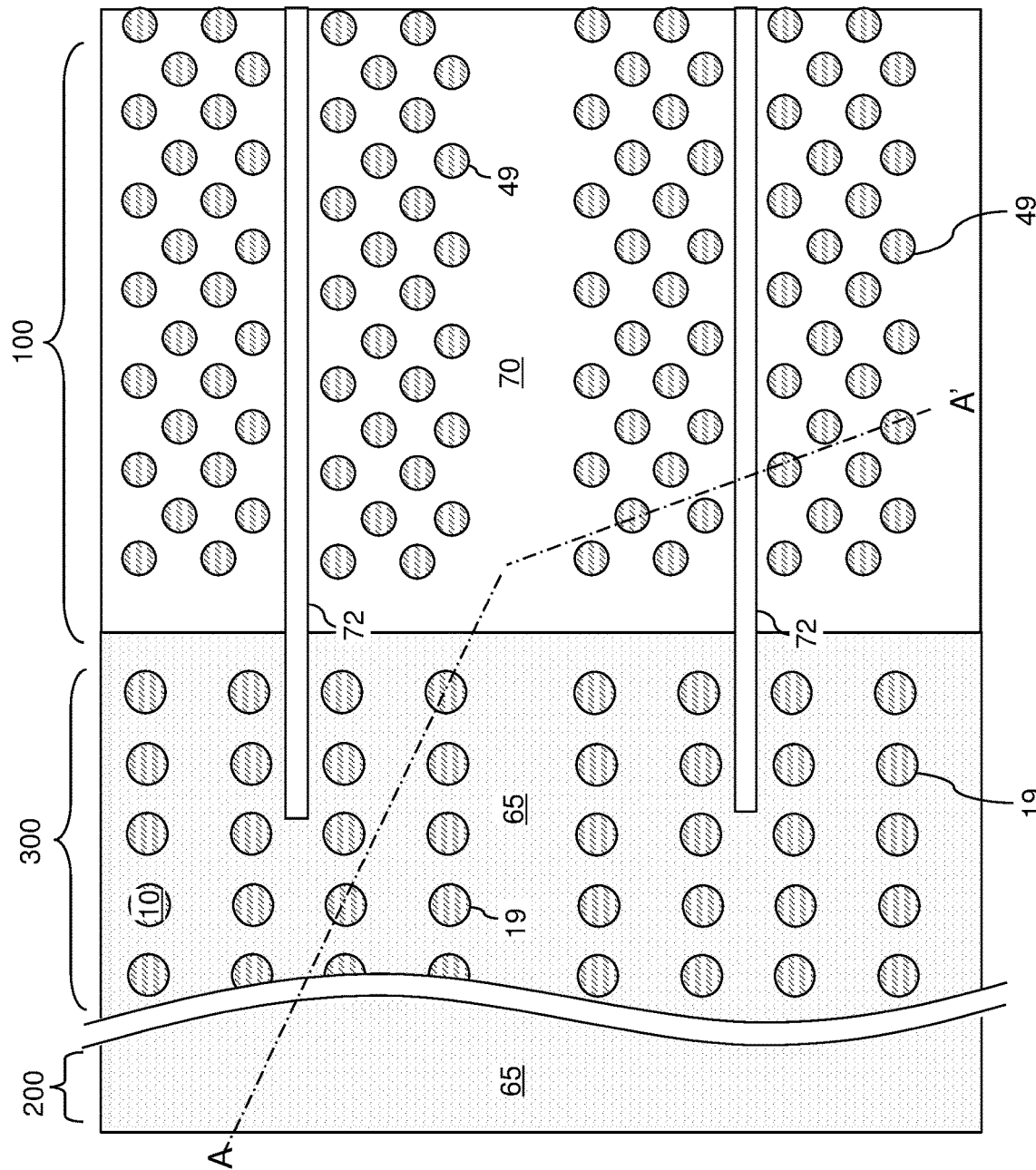
FIG. 4B is a top-down view of the first exemplary structure of FIG. 4A. The vertical plane A-A' is the plane of the cross-section for FIG. 4A.

Referring to FIGS. 4A and 4B, a lithographic material stack (not shown) including at least a photoresist layer can be formed over the insulating cap layer 70 and the retro-stepped dielectric material portion 65, and can be lithographically patterned to form openings therein. The openings include a first set of openings formed over the memory array region 100 and a second set of openings formed over the staircase region 300. The pattern in the lithographic material stack can be transferred through the insulating cap layer 70 or the retro-stepped dielectric material portion 65, and through the alternating stack (32, 42) by at least one anisotropic etch that employs the patterned lithographic material stack as an etch mask. Portions of the alternating stack (32, 42) underlying the openings in the patterned lithographic material stack are etched to form memory openings 49 and support openings 19. As used herein, a "memory opening" refers to a structure in which memory elements, such as a memory stack structure, is subsequently formed. As used herein, a "support opening" refers to a structure in which a support structure (such as a support pillar structure) that mechanically supports other elements is subsequently formed. The memory openings 49 are formed through the insulating cap layer 70 and the entirety of the alternating stack (32, 42) in the memory array region 100. The support openings 19 are formed through the retro-stepped dielectric material portion 65 and the portion of the alternating stack (32, 42) that underlie the stepped surfaces in the staircase region 300.

The memory openings 49 extend through the entirety of the alternating stack (32, 42). The support openings 19 extend through a subset of layers within the alternating stack (32, 42). The chemistry of the anisotropic etch process employed to etch through the materials of the alternating stack (32, 42) can alternate to optimize etching of the first and second materials in the alternating stack (32, 42). The anisotropic etch can be, for example, a series of reactive ion etches. The sidewalls of the memory openings 49 and the support openings 19 can be substantially vertical, or can be tapered. The patterned lithographic material stack can be subsequently removed, for example, by ashing.

The memory openings 49 and the support openings 19 can extend from the top surface of the alternating stack (32, 42) to at least the horizontal plane including the topmost surface of the semiconductor material layer 10. In one embodiment, an overetch into the semiconductor material layer 10 may be optionally performed after the top surface of the semiconductor material layer 10 is physically exposed at a bottom of each memory opening 49 and each support opening 19. The overetch may be performed prior to, or after, removal of the lithographic material stack. In other words, the recessed surfaces of the semiconductor material layer 10 may be vertically offset from the un-recessed top surfaces of the semiconductor material layer 10 by a recess depth. The recess depth can be, for example, in a range from 1 nm to 50 nm, although lesser and greater recess depths can also be employed. The overetch is optional, and may be omitted. If the overetch is not performed, the bottom surfaces of the memory openings 49 and the support openings 19 can be coplanar with the topmost surface of the semiconductor material layer 10.

Each of the memory openings 49 and the support openings 19 may include a sidewall (or a plurality of sidewalls) that extends substantially perpendicular to the topmost surface of the substrate. A two-dimensional array of memory openings 49 can be formed in the memory array region 100. A two-dimensional array of support openings 19 can be formed in the staircase region 300. The substrate semiconductor layer 9 and the semiconductor material layer 10 collectively constitutes a substrate (9, 10), which can be a semiconductor substrate. Alternatively, the semiconductor material layer 10 may be omitted, and the memory openings 49 and the support openings 19 can be extend to a top surface of the substrate semiconductor layer 9.

FIGS. 5A-5H illustrate structural changes in a memory opening 49, which is one of the memory openings 49 in the first exemplary structure of FIGS. 4A and 4B. The same structural change occurs simultaneously in each of the other memory openings 49 and in each of the support openings 19.

Referring to FIG. 5A, a memory opening 49 in the exemplary device structure of FIGS. 4A and 4B is illustrated. The memory opening 49 extends through the insulating cap layer 70, the alternating stack (32, 42), and optionally into an upper region of the semiconductor material layer 10. At this processing step, each support opening 19 can extend through the retro-stepped dielectric material portion 65, a subset of layers in the alternating stack (32, 42), and optionally through the upper region of the semiconductor material layer 10. The recess depth of the bottom surface of each memory opening with respect to the top surface of the semiconductor material layer 10 can be in a range from 0 nm to 30 nm, although greater recess depths can also be employed. Optionally, the sacrificial material layers 42 can be laterally recessed partially to form lateral recesses (not shown), for example, by an isotropic etch.

Referring to FIG. 5B, an optional pedestal channel portion (e.g., an epitaxial pedestal) 11 can be formed at the bottom portion of each memory opening 49 and each support openings 19, for example, by selective epitaxy. Each pedestal channel portion 11 comprises a single crystalline semiconductor material in epitaxial alignment with the single crystalline semiconductor material of the semiconductor material layer 10. In one embodiment, the top surface of each pedestal channel portion 11 can be formed above a horizontal plane including the top surface of a bottommost sacrificial material layer 42. In this case, a source select gate electrode can be subsequently formed by replacing the bottommost sacrificial material layer 42 with a conductive material layer. The pedestal channel portion 11 can be a portion of a transistor channel that extends between a source region to be subsequently formed in the substrate (9, 10) and a drain region to be subsequently formed in an upper region of the memory opening 49. A memory cavity 49' is present in the unfilled portion of the memory opening 49 above the pedestal channel portion 11. In one embodiment, the pedestal channel portion 11 can comprise single crystalline silicon. In one embodiment, the pedestal channel portion 11 can have a doping of the first conductivity type, which is the same as the conductivity type of the semiconductor material layer 10 that the pedestal channel portion contacts. If a semiconductor material layer 10 is not present, the pedestal channel portion 11 can be formed directly on the substrate semiconductor layer 9, which can have a doping of the first conductivity type.

Referring to FIG. 5C, a stack of layers including a blocking dielectric layer 52, a charge storage layer 54, a tunneling dielectric layer 56, and an optional first semiconductor channel layer 601 can be sequentially deposited in the memory openings 49.

The blocking dielectric layer 52 can include a single dielectric material layer or a stack of a plurality of dielectric material layers. In one embodiment, the blocking dielectric layer can include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 can include a dielectric metal oxide having a dielectric constant greater than 7.9, i.e., having a dielectric constant greater than the dielectric constant of silicon nitride. Alternatively or additionally, the blocking dielectric layer 52 can include a dielectric semiconductor compound such as silicon oxide, silicon oxynitride, silicon nitride, or a combination thereof. The thickness of the blocking dielectric layer 52 can be in a range from 1 nm to 20 nm, although lesser and greater thicknesses can also be employed. Alternatively, the blocking dielectric layer 52 can be omitted, and a backside blocking dielectric layer can be formed after formation of backside recesses on surfaces of memory films to be subsequently formed.

Subsequently, the charge storage layer 54 can be formed. In one embodiment, the charge storage layer 54 can be a continuous layer or patterned discrete portions of a charge trapping material including a dielectric charge trapping material, which can be, for example, silicon nitride. Alternatively, the charge storage layer 54 can include a continuous layer or patterned discrete portions of a conductive material such as doped polysilicon or a metallic material that is patterned into multiple electrically isolated portions (e.g., floating gates), for example, by being formed within lateral recesses into sacrificial material layers 42. In one embodiment, the charge storage layer 54 includes a silicon nitride layer. In one embodiment, the sacrificial material layers 42 and the insulating layers 32 can have vertically coincident sidewalls, and the charge storage layer 54 can be formed as a single continuous layer.

In another embodiment, the sacrificial material layers 42 can be laterally recessed with respect to the sidewalls of the insulating layers 32, and a combination of a deposition process and an anisotropic etch process can be employed to form the charge storage layer 54 as a plurality of memory material portions that are vertically spaced apart. While the present disclosure is described employing an embodiment in which the charge storage layer 54 is a single continuous layer, embodiments are expressly contemplated herein in which the charge storage layer 54 is replaced with a plurality of memory material portions (which can be charge trapping material portions or electrically isolated conductive material portions) that are vertically spaced apart.

The charge storage layer 54 can be formed as a single charge storage layer of homogeneous composition, or can include a stack of multiple charge storage layers. The multiple charge storage layers, if employed, can comprise a plurality of spaced-apart floating gate material layers that contain conductive materials (e.g., metal such as tungsten, molybdenum, tantalum, titanium, platinum, ruthenium, and alloys thereof, or a metal silicide such as tungsten silicide, molybdenum silicide, tantalum silicide, titanium silicide, nickel silicide, cobalt silicide, or a combination thereof) and/or semiconductor materials (e.g., polycrystalline or amorphous semiconductor material including at least one elemental semiconductor element or at least one compound semiconductor material). Alternatively or additionally, the charge storage layer 54 may comprise an insulating charge trapping material, such as one or more silicon nitride segments. Alternatively, the charge storage layer 54 may comprise conductive nanoparticles such as metal nanoparticles, which can be, for example, ruthenium nanoparticles. The charge storage layer 54 can be formed, for example, by chemical vapor deposition (CVD), atomic layer deposition (ALD), physical vapor deposition (PVD), or any suitable deposition technique for storing electrical charges therein. The thickness of the charge storage layer 54 can be in a range from 2 nm to 20 nm, although lesser and greater thicknesses can also be employed.

Generally, a vertical stack of memory elements can be formed at levels of the spacer material layers at a periphery of each memory opening 49. The spacer material layers may be sacrificial material layers 42 that are subsequently replaced with electrically conductive layers. Alternatively, the spacer material layers may be formed as electrically conductive layers. Each vertical stack of memory elements can comprise portions of a charge storage layer 54 formed within a respective memory opening 49 and continuously extending through the spacer material layers of the alternating stack, such as the sacrificial material layers 42 of the alternating stack.

The tunneling dielectric layer 56 includes a dielectric material through which charge tunneling can be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 can include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 can include a stack of a first silicon oxide layer, a silicon oxynitride layer, and a second silicon oxide layer, which is commonly known as an ONO stack. In one embodiment, the tunneling dielectric layer 56 can include a silicon oxide layer that is substantially free of carbon or a silicon oxynitride layer that is substantially free of carbon. The thickness of the tunneling dielectric layer 56 can be in a range from 2 nm to 20 nm, although lesser and greater thicknesses can also be employed.

The optional first semiconductor channel layer 601 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the first semiconductor channel layer 601 includes amorphous silicon or polysilicon. The first semiconductor channel layer 601 can be formed by a conformal deposition method such as low pressure chemical vapor deposition (LPCVD). The atomic concentration of dopants of the first conductivity type in the first semiconductor channel layer 601 can be in a range from $1.0 \times 10^{14}/cm^3$ to $1.0 \times 10^{18}/cm^3$, although lesser and greater dopant concentrations can also be employed. The thickness of the first semiconductor channel layer 601 can be in a range from 2 nm to 10 nm, although lesser and greater thicknesses can also be employed. A memory cavity 49' is formed in the volume of each memory opening 49 that is not filled with the deposited material layers (52, 54, 56, 601).

Referring to FIG. 5D, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region.

A surface of the pedestal channel portion 11 (or a surface of the semiconductor material layer 10 in case the pedestal channel portions 11 are not employed) can be physically exposed underneath the opening through the first semiconductor channel layer 601, the tunneling dielectric layer 56, the charge storage layer 54, and the blocking dielectric layer 52. Optionally, the physically exposed semiconductor surface at the bottom of each memory cavity 49' can be vertically recessed so that the recessed semiconductor surface underneath the memory cavity 49' is vertically offset from the topmost surface of the pedestal channel portion 11 (or of the semiconductor material layer 10 in case pedestal channel portions 11 are not employed) by a recess distance. A tunneling dielectric layer 56 is located over the charge storage layer 54. A set of a blocking dielectric layer 52, a charge storage layer 54, and a tunneling dielectric layer 56 in a memory opening 49 constitutes a memory film 50, which includes a plurality of charge storage regions (as embodied as the charge storage layer 54) that are insulated from surrounding materials by the blocking dielectric layer 52 and the tunneling dielectric layer 56. In one embodiment, the first semiconductor channel layer 601, the tunneling dielectric layer 56, the charge storage layer 54, and the blocking dielectric layer 52 can have vertically coincident sidewalls.

Referring to FIG. 5E, a second semiconductor channel layer 602 can be deposited directly on the semiconductor surface of the pedestal channel portion 11 or the semiconductor material layer 10 if the pedestal channel portion 11 is omitted, and directly on the first semiconductor channel layer 601. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The atomic concentration of dopants of the first conductivity type in the second semiconductor channel layer 602 can be in a range from $1.0 \times 10^{14}/cm^3$ to $1.0 \times 10^{18}/cm^3$, although lesser and greater dopant concentrations can also be employed. The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The combination of the first semiconductor channel layer 601 and the second semiconductor channel layer 602 is herein referred to as a semiconductor channel material layer (601, 602). The semiconductor channel material layer (601, 602) has a doping of the first conductivity type, and is formed over the vertical stack of memory elements. The average atomic concentration of dopants of the first conductivity type in the semiconductor channel material layer (601, 602) can be in a range from $1.0 \times 10^{14}/cm^3$ to $1.0 \times 10^{18}/cm^3$, although lesser and greater dopant concentrations can also be employed. In alternative embodiments, the first semiconductor channel layer 601 may be a sacrificial layer that is removed prior to formation of the second semiconductor channel layer 602 or the first semiconductor channel layer 601 may be omitted entirely. In these alternative embodiments, the semiconductor channel material layer includes only layer 602.

Referring to FIG. 5F, in case the memory cavity 49' in each memory opening is not completely filled by the second semiconductor channel layer 602, a dielectric core layer 62L can be deposited in the memory cavity 49' to fill any remaining portion of the memory cavity 49' within each memory opening. The dielectric core layer 62L includes a dielectric material such as silicon oxide or organosilicate glass. The dielectric core layer 62L can be deposited by a conformal deposition method such as low pressure chemical vapor deposition (LPCVD), or by a self-planarizing deposition process such as spin coating.

Referring to FIG. 5G, the horizontal portion of the dielectric core layer 62L can be removed, for example, by a recess etch from above the top surface of the second semiconductor channel layer 602 to leave a recess cavity 49C with an unfilled volume in the memory opening 49. Further, the material of the dielectric core layer 62L can be vertically recessed selective to the semiconductor material of the second semiconductor channel layer 602 into each memory opening 49 down to a depth between a first horizontal plane including the top surface of the topmost one of the spacer material layers (such as the top surface of the topmost sacrificial material layer 42T) and a second horizontal plane including the top surface of the second topmost one of the spacer material layers (such as the top surface of the second sacrificial material layer 42S as counted from the top). Each remaining portion of the dielectric core layer 62L constitutes a dielectric core 62. The topmost sacrificial material layer 42T is a terminal spacer material layer which is subsequently replaced by a drain select gate electrode (SGD) of a select transistor, as will be described below with respect to FIGS. 12A and 12B. The second topmost sacrificial material layer 42 is the second sacrificial material layer 42 as counted from the top.

As used herein, a "terminal" element refers to a last element of a set of elements arranged along a single direction (such as a vertical direction), and may be the first one or the last one. If elements are arranged along a vertical direction, a terminal element may be the bottommost element or a topmost element. In the case of an alternating stack including the insulating layers 32 and spacer material layers (such as the sacrificial material layers 42), a terminal spacer material layer may be the topmost spacer material layer (such as the topmost sacrificial material layer 42T) and/or a bottommost spacer material layer (such as the bottommost sacrificial material layer 42).

Generally, the dielectric core 62 can be formed within a cavity located inside the semiconductor channel material layer (601, 602) by depositing and recessing the dielectric core material. The dielectric core 62 is formed on an inner sidewall of the material of the semiconductor channel material layer (601, 602). In one embodiment, the top surface of each dielectric core 62 can be located between the horizontal plane including the top surface of the topmost sacrificial material layer 42T and the bottom surface of the topmost sacrificial material layer 42T. In another embodiment, the top surface of each dielectric core 62 can be located between the horizontal plane including the top surface of the topmost insulating layer 32T (which contacts the bottom surface of the topmost sacrificial material layer 42) and the horizontal plane including the bottom surface of the topmost insulating layer 32T (which contacts the top surface of the second topmost sacrificial material layer 42S). Alternatively, the top surface of each dielectric core 62 may be in the same horizontal plane as the bottom surface of the topmost sacrificial material layer 42T.

Referring to FIG. 5H, a semiconductor fill material which may be intrinsic or have a doping of the first conductivity type, can be deposited in each unfilled volume of the recess cavity 49C of the memory openings 49 and the support openings 19. Thus, the semiconductor fill material can be deposited above the dielectric core 62 within a recess cavity 49C that is surrounded by the semiconductor channel material layer (601, 602) within each memory openings 49 and within each support opening 19. The semiconductor fill material may include an elemental semiconductor material (such as silicon or germanium) or a compound semiconductor material. For example, the semiconductor fill material can include intrinsic or doped polysilicon or amorphous silicon. The atomic concentration of dopants of the first conductivity type in the semiconductor fill material can be in a range from $1.0\times10^{14}/cm^3$ to $1.0\times10^{18}/cm^3$, although lesser and greater dopant concentrations can also be employed. The portions of the second semiconductor channel layer 602 and the semiconductor fill material located above the horizontal plane including the top surface of the insulating cap layer 70 can be removed by a planarization process, which can employ a recess etch or chemical mechanical planarization (CMP). The planarization process can employ the top surface of the insulating layer 70 as a stopping surface.

The remaining portions of the second semiconductor channel layer 602 and the semiconductor fill material within each memory opening 49 or within each support opening 19 can have top surfaces locate at, or about, the horizontal plane including the top surface of the insulating cap layer 70. Each remaining portion of the semiconductor fill material constitutes a channel cap portion 603. The channel cap portion 603 contacts an inner sidewall of the semiconductor channel material layer (601, 602) and a top surface of a dielectric core 62. Each contiguous combination of a semiconductor channel material layer (601, 602) and a channel cap portion 603 constitutes a vertical semiconductor channel 60. The materials of the first semiconductor channel layer 601, the second semiconductor channel layer 602, and the channel cap portion 603 are collectively referred to as a semiconductor channel material. In other words, the semiconductor channel material is a set of all semiconductor material in the first semiconductor channel layer 601, the second semiconductor channel layer 602, and the channel cap portion 603.

Figure 5I:
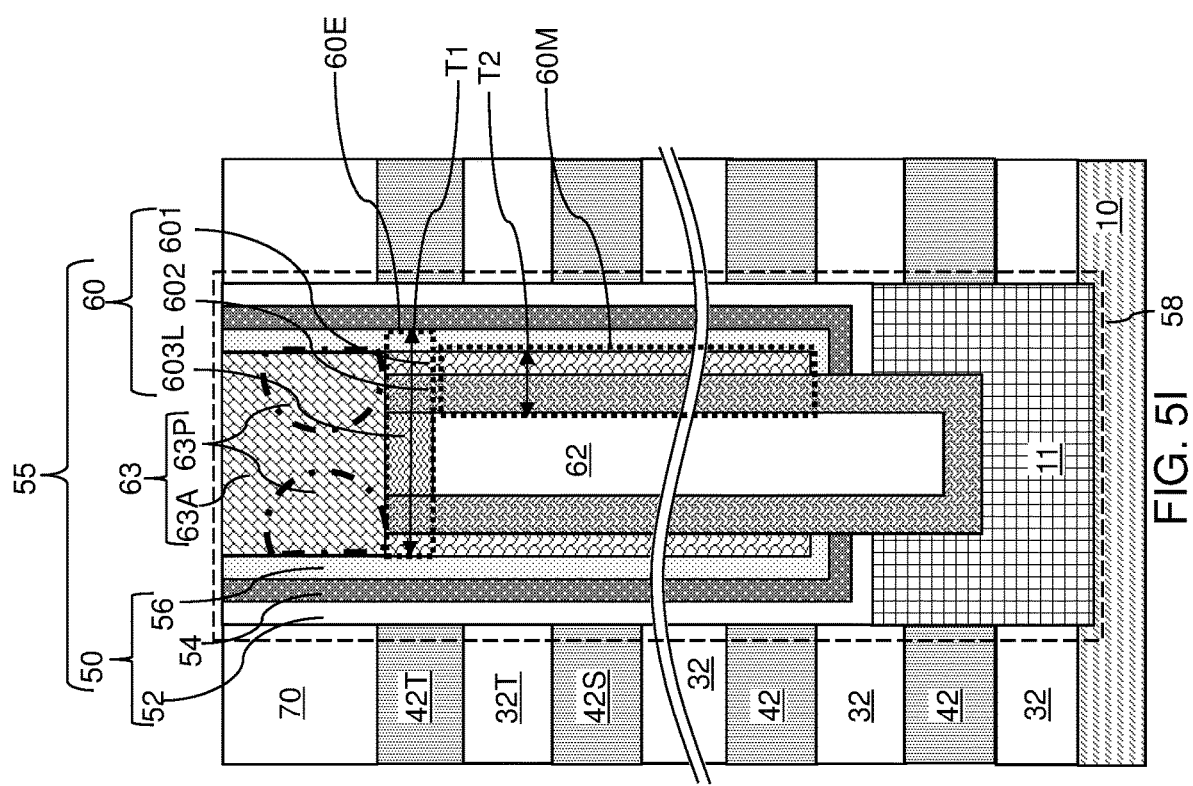

Referring to FIG. 5I, dopants of a second conductivity type can be implanted into an upper portion of each vertical semiconductor channel 60. Specifically, the dopants of the second conductivity type are implanted an upper region of each combination of a semiconductor channel material layer (601, 602) and a channel cap portion 603. The second conductivity type is the opposite of the first conductivity type. For example, if the first conductivity type is p-type, the second conductivity type in n-type, and vice versa. Each contiguous implanted portion of a combination of a semiconductor channel material layer (601, 602) and a channel cap portion 603 constitutes an active region, which may be a source region or a drain region. In case each active region in the memory openings 49 is subsequently connected to a respective bit line, the active regions can be drain regions 63. The net dopant concentration of the dopants of the second conductivity type of each drain region 63 can be in a range from $5.0\times10^{19}/cm^3$ to $2.0\times10^{21}/cm^3$, although lesser and greater dopant concentrations can also be employed. As used herein, a net dopant concentration is the difference between the dopant concentrations of dopants of opposite conductivity types. Generally, the active regions (such as the drain regions 63) can be formed by implanting dopants of the second conductivity type into an upper region of the semiconductor channel material layer (601, 602) and into an upper region of the semiconductor fill material in the memory openings 49. In one embodiment, both arsenic and phosphorus implantations may be carried out to form a drain region 63 containing respective arsenic doped region 63A and phosphorus doped region 63P, as shown in FIG. 5I.

According to an embodiment of the present disclosure, a lower region 603L of each channel cap portion 603 is not implanted with the dopants of the second conductivity type. Thus, only an upper region of each channel cap portion 603 is converted into a portion of a drain region 63, and a lower region of each channel cap portion 603 remains as a channel cap portion 603, which may be intrinsic or have a doping of the first conductivity type. The vertical semiconductor channel 60 comprises an unimplanted portion of the semiconductor channel material layer (601, 602) and an unimplanted portion of the semiconductor fill material 603L. Thus, a p-n junction is formed within a horizontal plane including an interface between the vertical semiconductor channel 60 and an overlying active region, which can be a drain region 63. The horizontal plane including the p-n junction can be located between a top surface of the topmost one of the spacer material layers (such as the topmost sacrificial material layer 42T) and a bottom surface of the topmost one of the spacer material layers (such as the topmost sacrificial material layer 42T). The p-n junction is located above the interface between the dielectric core 62 and the unimplanted portion of the semiconductor fill material, which is the lower region 603L of the channel cap portion 603 as provided after formation of the drain regions 63. The end portion 60E of the vertical semiconductor channel 60 has a first thickness T1, and a middle portion 60M of the vertical semiconductor channel 60 has a second thickness T2 which is less than the first thickness T1. As used herein, thickness may be the lateral dimension of the semiconductor channel 60. For example, for a cylindrical shaped channel, the first thickness T1 corresponds to the horizontal diameter of the end portion 60E of the vertical semiconductor channel.

Each adjoining set of the optional first semiconductor channel layer 601, the second semiconductor channel layer 602, and the lower region 603L channel cap portion 603 constitutes a vertical semiconductor channel 60 through which electrical current can flow when a vertical NAND device including the vertical semiconductor channel 60 is turned on. The area of the p-n junction can be the same as the area of the bottom surface of the drain region 63, and can be the same as the area of the top surface of the vertical semiconductor channel 60. A tunneling dielectric layer 56 is surrounded by a charge storage layer 54, and the tunneling dielectric 56 laterally surrounds a portion of the vertical semiconductor channel 60. Each adjoining set of a tunneling dielectric layer 56, a charge storage layer 54, and an optional blocking dielectric layer 52 collectively constitute a memory film 50, which includes a vertical stack of memory elements (e.g., portion of layer 54) that can store a respective data bit with a macroscopic retention time. As used herein, a macroscopic retention time refers to a retention time suitable for operation of a memory device as a permanent memory device such as a retention time in excess of 24 hours. In alternative embodiments, a blocking dielectric layer 52 may not be formed in each memory opening 49, and may be subsequently formed in backside recesses that are formed by removal of the sacrificial material layers 42 at a subsequent processing step shown in FIG. 9B.

Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements comprising portions of the charge storage layer 54, and a blocking dielectric layer 52. Each combination of a pedestal channel portion 11 (if present), a memory stack structure 55, a dielectric core 62, and a drain region 63 within a memory opening 49 is herein referred to as a memory opening fill structure 58. Each combination of a pedestal channel portion 11 (if present), a memory film 50, a vertical semiconductor channel 60, a dielectric core 62, and a drain region 63 within each support opening 19 fills the respective support openings 19, and constitutes a support pillar structure.

Figure 6:
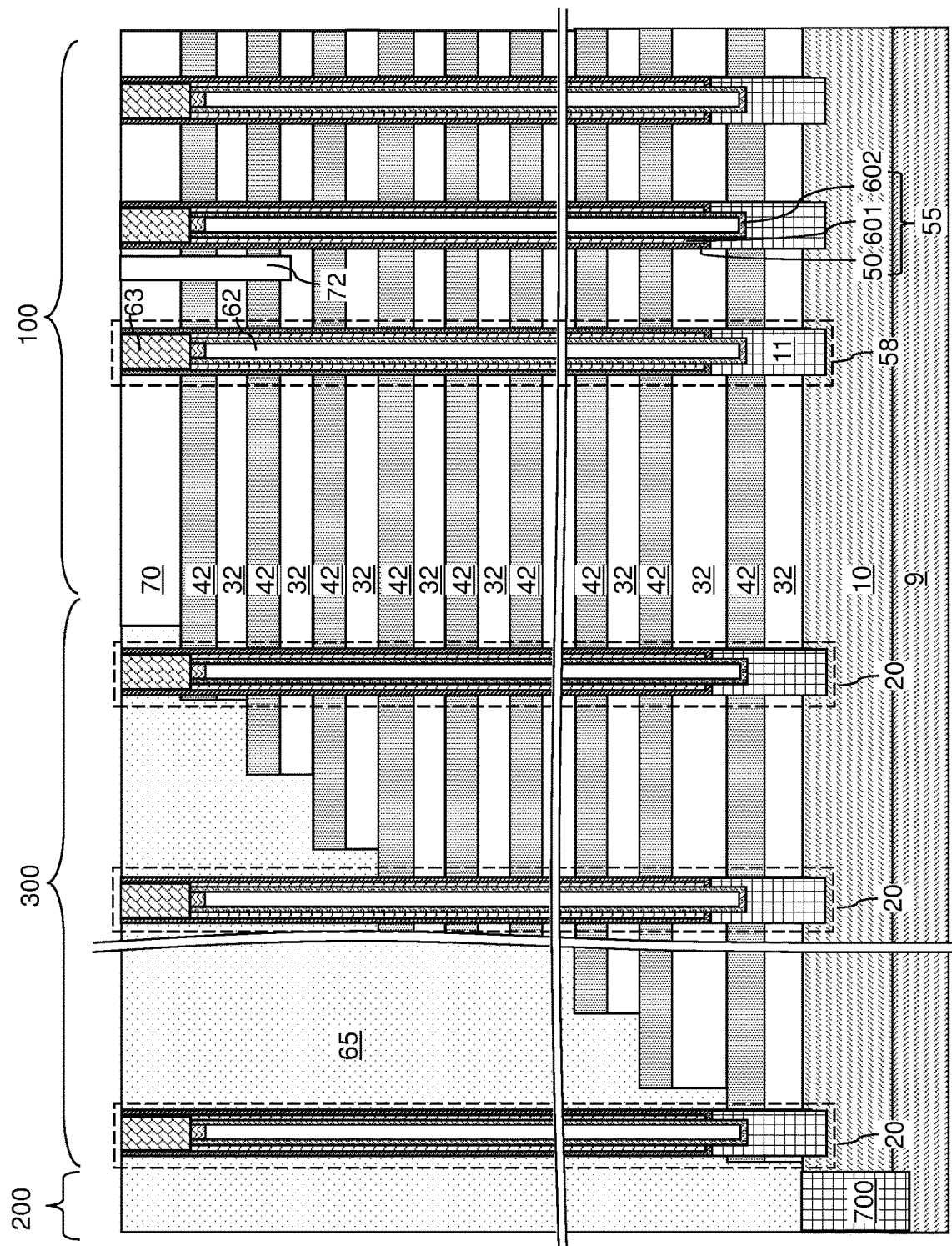
FIG. 6 is a schematic vertical cross-sectional view of the first exemplary structure after formation of memory stack structures and support pillar structures according to the first embodiment of the present disclosure.

Referring to FIG. 6, the first exemplary structure is illustrated after formation of memory opening fill structures 58 and support pillar structure 20 within the memory openings 49 and the support openings 19, respectively. An instance of a memory opening fill structure 58 can be formed within each memory opening 49 of the structure of FIGS. 4A and 4B. An instance of the support pillar structure 20 can be formed within each support opening 19 of the structure of FIGS. 4A and 4B.

Each memory stack structure 55 includes a vertical semiconductor channel 60 and a channel cap portion 603, and a memory film 50. The vertical semiconductor channel 60 may comprise multiple semiconductor channel layers (601, 602) and includes a channel cap portion 603. The memory film 50 may comprise a tunneling dielectric layer 56 laterally surrounding the vertical semiconductor channel 60, a vertical stack of charge storage regions (as embodied as a charge storage layer 54) laterally surrounding the tunneling dielectric layer 56, and an optional blocking dielectric layer 52. While the present disclosure is described employing the illustrated configuration for the memory stack structure, the methods of the present disclosure can be applied to alternative memory stack structures including different layer stacks or structures for the memory film 50 and/or for the vertical semiconductor channel 60.

Figure 7A:
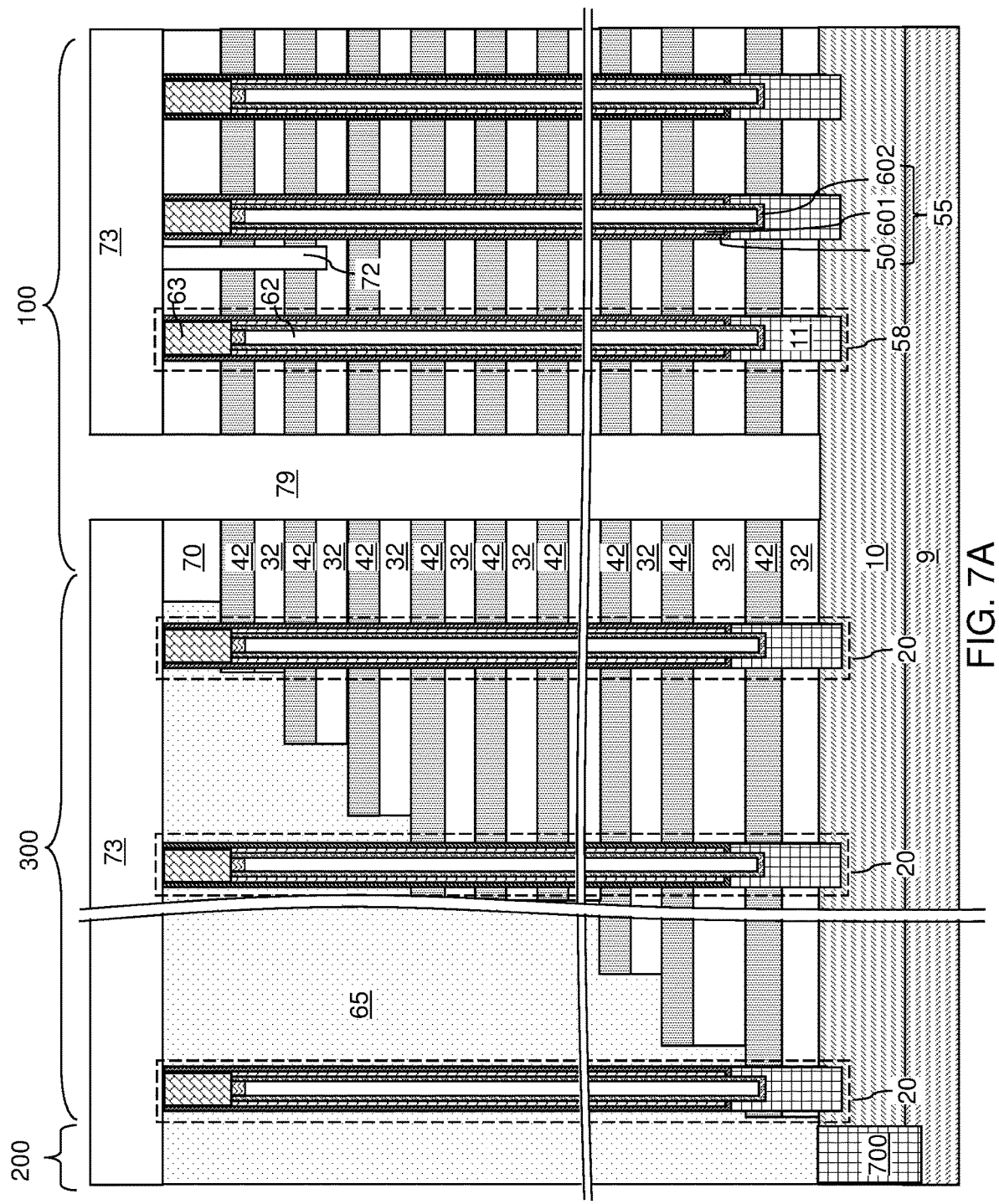
FIG. 7A is a schematic vertical cross-sectional view of the first exemplary structure after formation of backside trenches according to the first embodiment of the present disclosure.
Figure 7B:
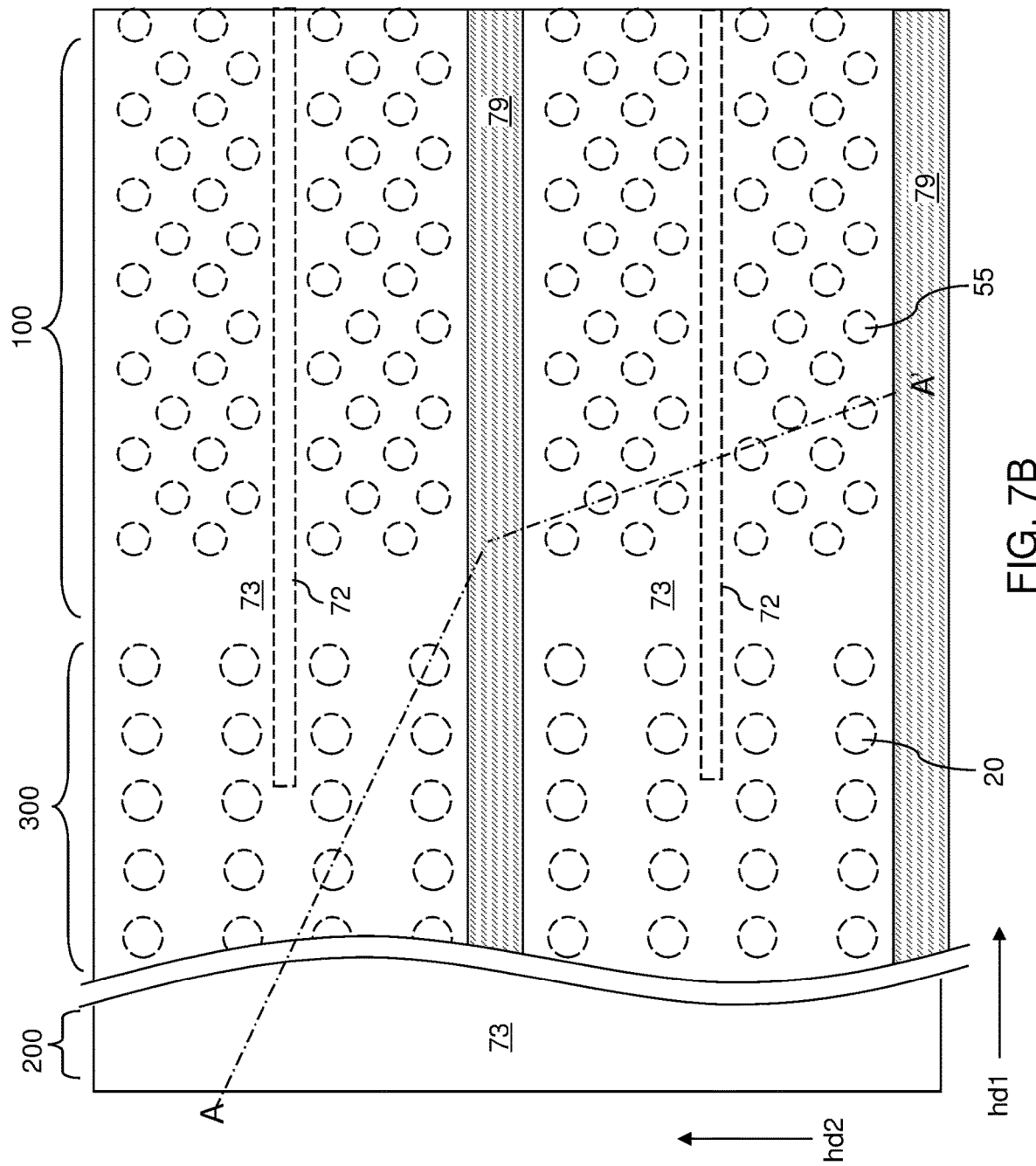
FIG. 7B is a partial see-through top-down view of the first exemplary structure of FIG. 7A. The vertical plane A-A' is the plane of the schematic vertical cross-sectional view of FIG. 7A.

Referring to FIGS. 7A and 7B, a contact level dielectric layer 73 can be formed over the alternating stack (32, 42) of insulating layer 32 and sacrificial material layers 42, and over the memory stack structures 55 and the support pillar structures 20. The contact level dielectric layer 73 includes a dielectric material that is different from the dielectric material of the sacrificial material layers 42. For example, the contact level dielectric layer 73 can include silicon oxide. The contact level dielectric layer 73 can have a thickness in a range from 50 nm to 500 nm, although lesser and greater thicknesses can also be employed.

A photoresist layer (not shown) can be applied over the contact level dielectric layer 73, and is lithographically patterned to form openings in areas between clusters of memory stack structures 55. The pattern in the photoresist layer can be transferred through the contact level dielectric layer 73, the alternating stack (32, 42) and/or the retro-stepped dielectric material portion 65 employing an anisotropic etch to form backside trenches 79, which vertically extend from the top surface of the contact level dielectric layer 73 at least to the top surface of the substrate (9, 10), and laterally extend through the memory array region 100 and the staircase region 300.

In one embodiment, the backside trenches 79 can laterally extend along a first horizontal direction hd1 and can be laterally spaced apart among one another along a second horizontal direction hd2 that is perpendicular to the first horizontal direction hd1. The memory stack structures 55 can be arranged in rows that extend along the first horizontal direction hd1. The drain select level isolation structures 72 can laterally extend along the first horizontal direction hd1. Each backside trench 79 can have a uniform width that is invariant along the lengthwise direction (i.e., along the first horizontal direction hd1). Each drain select level isolation structure 72 can have a uniform vertical cross-sectional profile along vertical planes that are perpendicular to the first horizontal direction hd1 that is invariant with translation along the first horizontal direction hd1. Multiple rows of memory stack structures 55 can be located between a neighboring pair of a backside trench 79 and a drain select level isolation structure 72, or between a neighboring pair of drain select level isolation structures 72. In one embodiment, the backside trenches 79 can include a source contact opening in which a source contact via structure can be subsequently formed. The photoresist layer can be removed, for example, by ashing.

Figure 8:
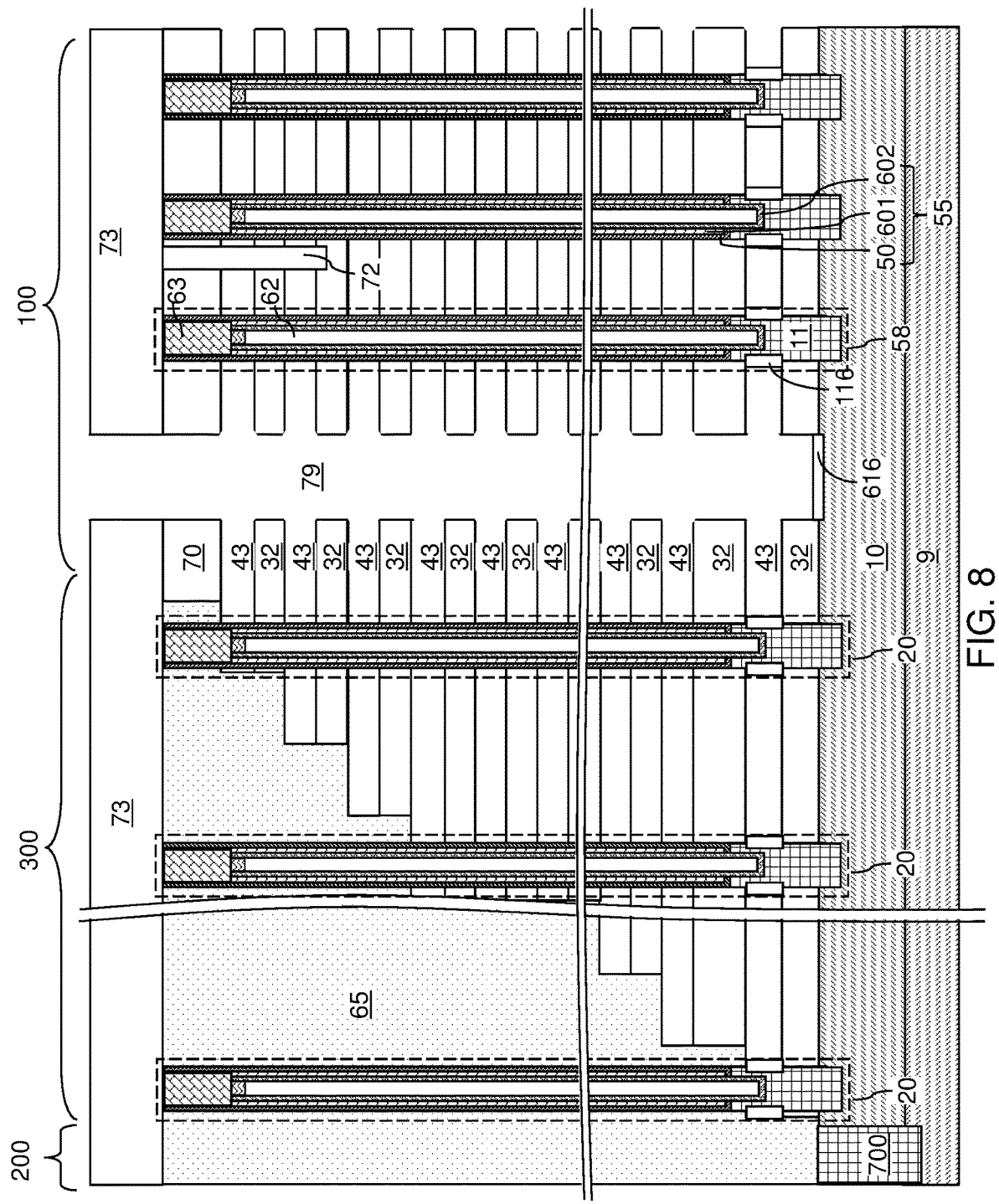
FIG. 8 is a schematic vertical cross-sectional view of the first exemplary structure after formation of backside recesses according to the first embodiment of the present disclosure.

Referring to FIGS. 8 and 9A, an etchant that selectively etches the second material of the sacrificial material layers 42 with respect to the first material of the insulating layers 32 can be introduced into the backside trenches 79, for example, employing an etch process. FIG. 9A illustrates a region of the first exemplary structure of FIG. 8. Backside recesses 43 are formed in volumes from which the sacrificial material layers 42 are removed. The removal of the second material of the sacrificial material layers 42 can be selective to the first material of the insulating layers 32, the material of the retro-stepped dielectric material portion 65, the semiconductor material of the semiconductor material layer 10, and the material of the outermost layer of the memory films 50. In one embodiment, the sacrificial material layers 42 can include silicon nitride, and the materials of the insulating layers 32 and the retro-stepped dielectric material portion 65 can be selected from silicon oxide and dielectric metal oxides.

The etch process that removes the second material selective to the first material and the outermost layer of the memory films 50 can be a wet etch process employing a wet etch solution, or can be a gas phase (dry) etch process in which the etchant is introduced in a vapor phase into the backside trenches 79. For example, if the sacrificial material layers 42 include silicon nitride, the etch process can be a wet etch process in which the first exemplary structure is immersed within a wet etch tank including phosphoric acid, which etches silicon nitride selective to silicon oxide, silicon, and various other materials employed in the art. The support pillar structure 20, the retro-stepped dielectric material portion 65, and the memory stack structures 55 provide structural support while the backside recesses 43 are present within volumes previously occupied by the sacrificial material layers 42.

Each backside recess 43 can be a laterally extending cavity having a lateral dimension that is greater than the vertical extent of the cavity. In other words, the lateral dimension of each backside recess 43 can be greater than the height of the backside recess 43. A plurality of backside recesses 43 can be formed in the volumes from which the second material of the sacrificial material layers 42 is removed. The memory openings in which the memory stack structures 55 are formed are herein referred to as front side openings or front side cavities in contrast with the backside recesses 43. In one embodiment, the memory array region 100 comprises an array of monolithic three-dimensional NAND strings having a plurality of device levels disposed above the substrate (9, 10). In this case, each backside recess 43 can define a space for receiving a respective word line of the array of monolithic three-dimensional NAND strings.

Each of the plurality of backside recesses 43 can extend substantially parallel to the top surface of the substrate (9, 10). A backside recess 43 can be vertically bounded by a top surface of an underlying insulating layer 32 and a bottom surface of an overlying insulating layer 32. In one embodiment, each backside recess 43 can have a uniform height throughout.

Physically exposed surface portions of the optional pedestal channel portions 11 and the semiconductor material layer 10 can be converted into dielectric material portions by thermal conversion and/or plasma conversion of the semiconductor materials into dielectric materials. For example, thermal conversion and/or plasma conversion can be employed to convert a surface portion of each pedestal channel portion 11 into a tubular dielectric spacer 116, and to convert each physically exposed surface portion of the semiconductor material layer 10 into a planar dielectric portion 616. In one embodiment, each tubular dielectric spacer 116 can be topologically homeomorphic to a torus, i.e., generally ring-shaped. As used herein, an element is topologically homeomorphic to a torus if the shape of the element can be continuously stretched without destroying a hole or forming a new hole into the shape of a torus. The tubular dielectric spacers 116 include a dielectric material that includes the same semiconductor element as the pedestal channel portions 11 and additionally includes at least one non-metallic element such as oxygen and/or nitrogen such that the material of the tubular dielectric spacers 116 is a dielectric material. In one embodiment, the tubular dielectric spacers 116 can include a dielectric oxide, a dielectric nitride, or a dielectric oxynitride of the semiconductor material of the pedestal channel portions 11. Likewise, each planar dielectric portion 616 includes a dielectric material that includes the same semiconductor element as the semiconductor material layer and additionally includes at least one non-metallic element such as oxygen and/or nitrogen such that the material of the planar dielectric portions 616 is a dielectric material. In one embodiment, the planar dielectric portions 616 can include a dielectric oxide, a dielectric nitride, or a dielectric oxynitride of the semiconductor material of the semiconductor material layer 10.

Referring to FIG. 9B, a backside blocking dielectric layer 44 can be optionally formed. The backside blocking dielectric layer 44, if present, comprises a dielectric material that functions as a control gate dielectric for the control gates to be subsequently formed in the backside recesses 43. In case the blocking dielectric layer 52 is present within each memory opening, the backside blocking dielectric layer 44 is optional. In case the blocking dielectric layer 52 is omitted, the backside blocking dielectric layer 44 is present.

The backside blocking dielectric layer 44 can be formed in the backside recesses 43 and on a sidewall of the backside trench 79. The backside blocking dielectric layer 44 can be formed directly on horizontal surfaces of the insulating layers 32 and sidewalls of the memory stack structures 55 within the backside recesses 43. If the backside blocking dielectric layer 44 is formed, formation of the tubular dielectric spacers 116 and the planar dielectric portion 616 prior to formation of the backside blocking dielectric layer 44 is optional. In one embodiment, the backside blocking dielectric layer 44 can be formed by a conformal deposition process such as atomic layer deposition (ALD). The backside blocking dielectric layer 44 can consist essentially of aluminum oxide. The thickness of the backside blocking dielectric layer 44 can be in a range from 1 nm to 15 nm, such as 2 to 6 nm, although lesser and greater thicknesses can also be employed.

The dielectric material of the backside blocking dielectric layer 44 can be a dielectric metal oxide such as aluminum oxide, a dielectric oxide of at least one transition metal element, a dielectric oxide of at least one Lanthanide element, a dielectric oxide of a combination of aluminum, at least one transition metal element, and/or at least one Lanthanide element. Alternatively or additionally, the backside blocking dielectric layer 44 can include a silicon oxide layer. The backside blocking dielectric layer 44 can be deposited by a conformal deposition method such as chemical vapor deposition or atomic layer deposition. The backside blocking dielectric layer 44 is formed on the sidewalls of the backside trenches 79, horizontal surfaces and sidewalls of the insulating layers 32, the portions of the sidewall surfaces of the memory stack structures 55 that are physically exposed to the backside recesses 43, and a top surface of the planar dielectric portion 616. A backside cavity 79' is present within the portion of each backside trench 79 that is not filled with the backside blocking dielectric layer 44.

Referring to FIG. 9C, a metallic barrier layer 46A can be deposited in the backside recesses 43. The metallic barrier layer 46A includes an electrically conductive metallic material that can function as a diffusion barrier layer and/or adhesion promotion layer for a metallic fill material to be subsequently deposited. The metallic barrier layer 46A can include a conductive metallic nitride material such as TiN, TaN, WN, or a stack thereof, or can include a conductive metallic carbide material such as TiC, TaC, WC, or a stack thereof. In one embodiment, the metallic barrier layer 46A can be deposited by a conformal deposition process such as chemical vapor deposition (CVD) or atomic layer deposition (ALD). The thickness of the metallic barrier layer 46A can be in a range from 2 nm to 8 nm, such as from 3 nm to 6 nm, although lesser and greater thicknesses can also be employed. In one embodiment, the metallic barrier layer 46A can consist essentially of a conductive metal nitride such as TiN.

Figure 10:
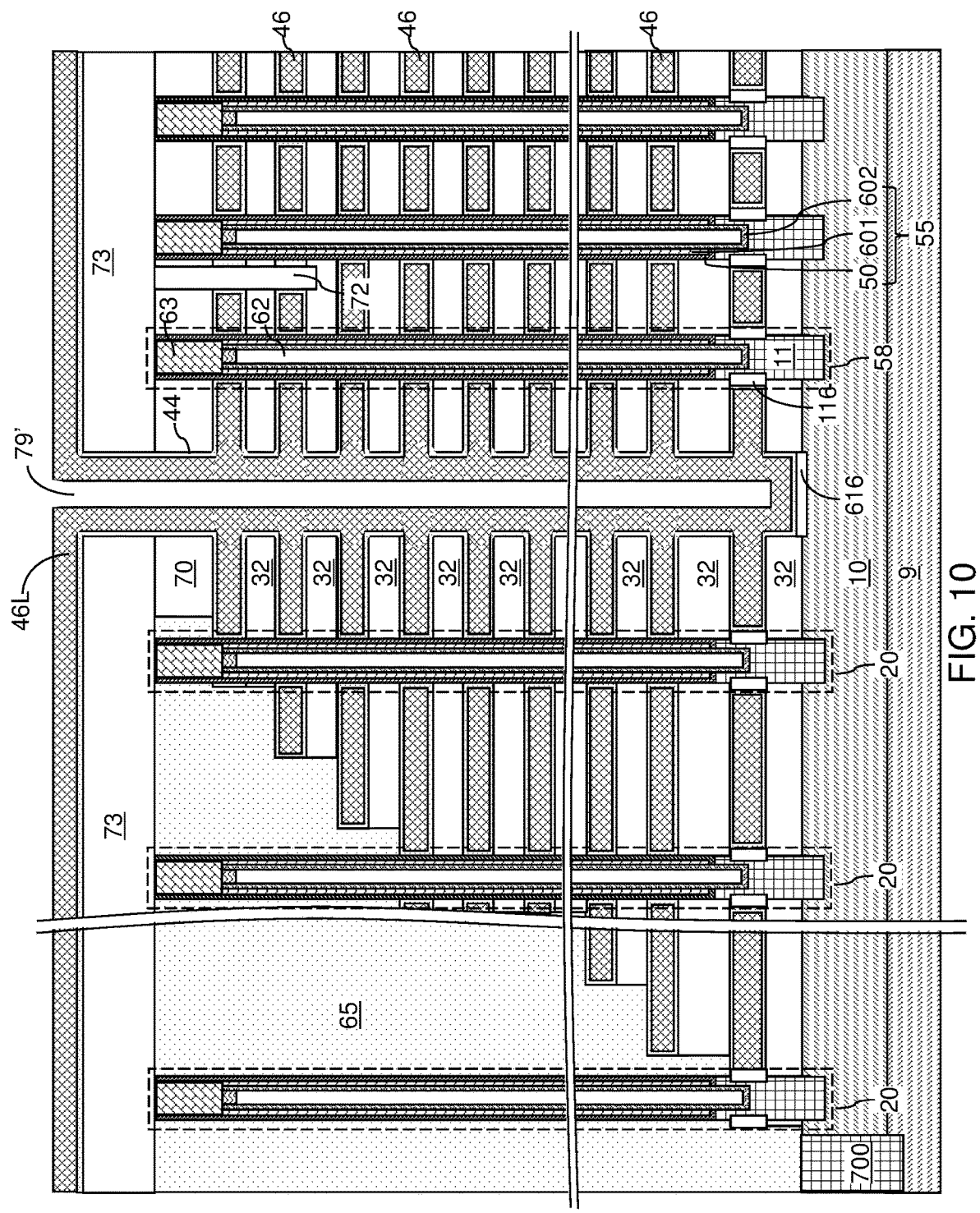
FIG. 10 is a schematic vertical cross-sectional view of the first exemplary structure at the processing step of FIG. 9D.

Referring to FIGS. 9D and 10, a metal fill material is deposited in the plurality of backside recesses 43, on the sidewalls of the at least one the backside trench 79, and over the top surface of the contact level dielectric layer 73 to form a metallic fill material layer 46B. The metallic fill material can be deposited by a conformal deposition method, which can be, for example, chemical vapor deposition (CVD), atomic layer deposition (ALD), electroless plating, electroplating, or a combination thereof.

In one embodiment, the metallic fill material layer 46B can consist essentially of at least one elemental metal. The at least one elemental metal of the metallic fill material layer 46B can be selected, for example, from tungsten, cobalt, ruthenium, titanium, and tantalum. In one embodiment, the metallic fill material layer 46B can consist essentially of a single elemental metal. In one embodiment, the metallic fill material layer 46B can be deposited employing a fluorine-containing precursor gas such as $WF_6$. In one embodiment, the metallic fill material layer 46B can be a tungsten layer including a residual level of fluorine atoms as impurities. The metallic fill material layer 46B is spaced from the insulating layers 32 and the memory stack structures 55 by the metallic barrier layer 46A, which is a metallic barrier layer that blocks diffusion of fluorine atoms therethrough.

A plurality of electrically conductive layers 46 can be formed in the plurality of backside recesses 43, and a continuous electrically conductive material layer 46L can be formed on the sidewalls of each backside trench 79 and over the contact level dielectric layer 73. Each electrically conductive layer 46 includes a portion of the metallic barrier layer 46A and a portion of the metallic fill material layer 46B that are located between a vertically neighboring pair of dielectric material layers such as a pair of insulating layers 32. The continuous electrically conductive material layer 46L includes a continuous portion of the metallic barrier layer 46A and a continuous portion of the metallic fill material layer 46B that are located in the backside trenches 79 or above the contact level dielectric layer 73.

Each sacrificial material layer 42 can be replaced with an electrically conductive layer 46. A backside cavity 79' is present in the portion of each backside trench 79 that is not filled with the backside blocking dielectric layer 44 and the continuous electrically conductive material layer 46L. A tubular dielectric spacer 116 laterally surrounds a pedestal channel portion 11. A bottommost electrically conductive layer 46 laterally surrounds each tubular dielectric spacer 116 upon formation of the electrically conductive layers 46.

Figure 11A:
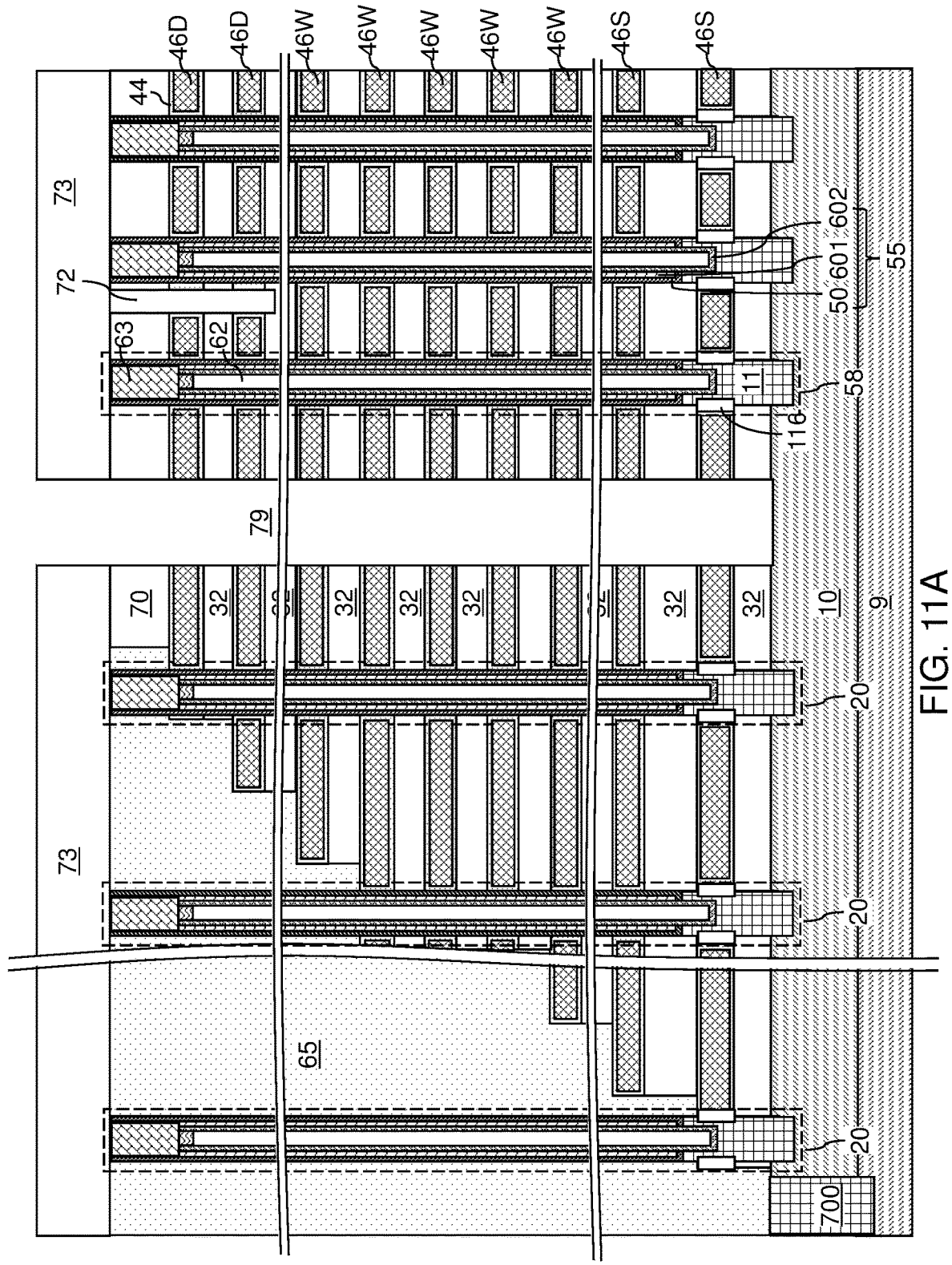
FIG. 11A is a schematic vertical cross-sectional view of the first exemplary structure after removal of a deposited conductive material from within the backside trench according to the first embodiment of the present disclosure.
Figure 11B:
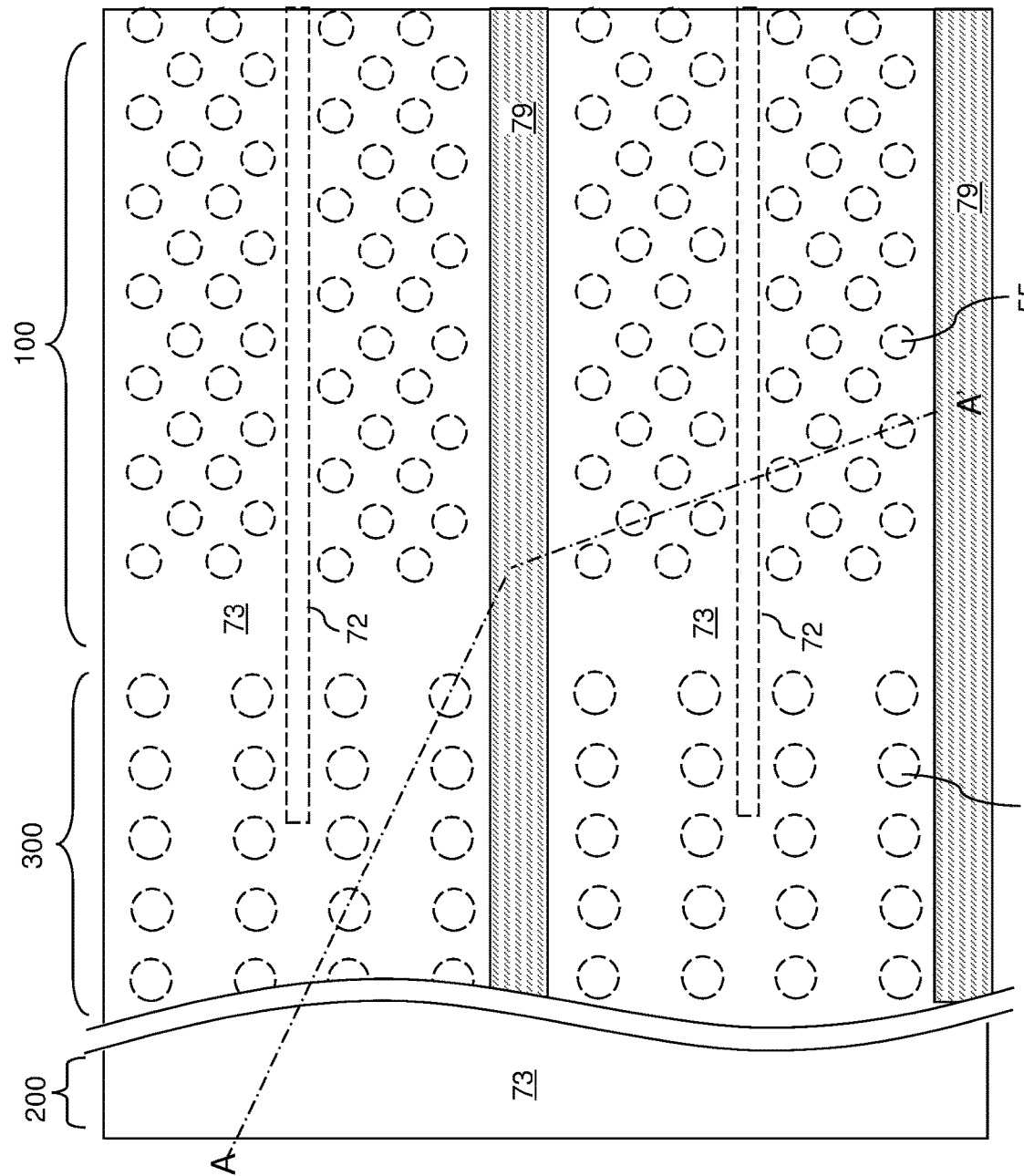
FIG. 11B is a partial see-through top-down view of the first exemplary structure of FIG. 11A. The vertical plane A-A' is the plane of the schematic vertical cross-sectional view of FIG. 11A.

Referring to FIG. 11, the deposited metallic material of the continuous electrically conductive material layer 46L is etched back from the sidewalls of each backside trench 79 and from above the contact level dielectric layer 73, for example, by an isotropic wet etch, an anisotropic dry etch, or a combination thereof. Each remaining portion of the deposited metallic material in the backside recesses 43 constitutes an electrically conductive layer 46. Each electrically conductive layer 46 can be a conductive line structure. Thus, the sacrificial material layers 42 are replaced with the electrically conductive layers 46, which comprise word lines 46W located between one or more drain select gate electrodes 46D and one or more source select gate electrodes 46S. For example, there may be one through six, such as two to four, of each type of select gate electrodes (46D, 46S).

Each word line 46W can function as a combination of a plurality of control gate electrodes located at a same level and a word line electrically interconnecting, i.e., electrically shorting, the plurality of control gate electrodes located at the same level. The plurality of control gate electrodes within each word line 46W are the control gate electrodes for the vertical memory devices including the memory stack structures 55. In other words, each middle electrically conductive layer 46W can be a word line that functions as a common control gate electrode for the plurality of vertical memory devices.

In one embodiment, the removal of the continuous electrically conductive material layer 46L can be selective to the material of the backside blocking dielectric layer 44. In this case, a horizontal portion of the backside blocking dielectric layer 44 can be present at the bottom of each backside trench 79. In another embodiment, the removal of the continuous electrically conductive material layer 46L may not be selective to the material of the backside blocking dielectric layer 44 or, the backside blocking dielectric layer 44 may not be employed. The planar dielectric portions 616 can be removed during removal of the continuous electrically conductive material layer 46L. A backside cavity 79' is present within each backside trench 79.

Figure 12A:
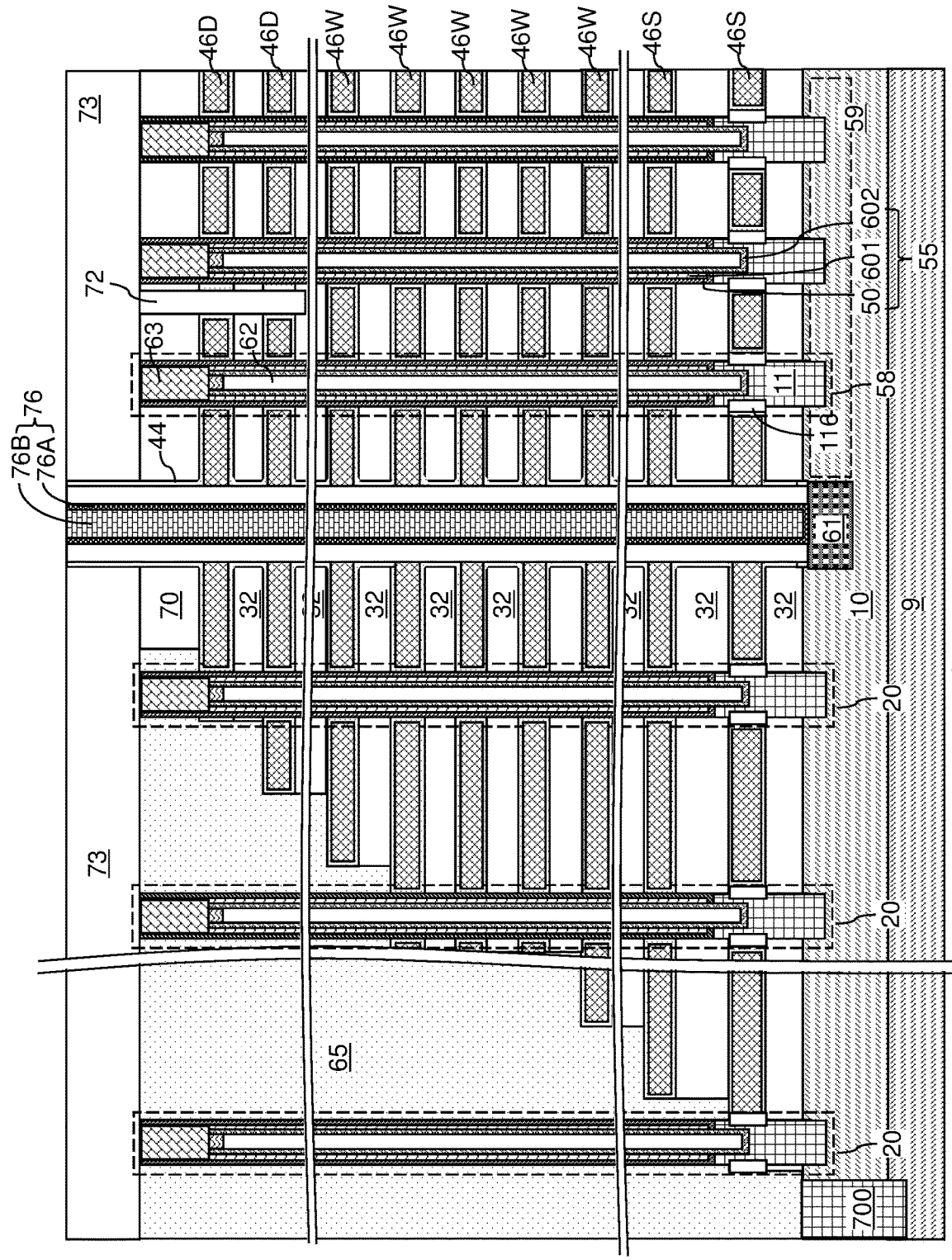
FIG. 12A is a schematic vertical cross-sectional view of the first exemplary structure after formation of an insulating spacer and a backside contact structure according to the first embodiment of the present disclosure.
Figure 12B:
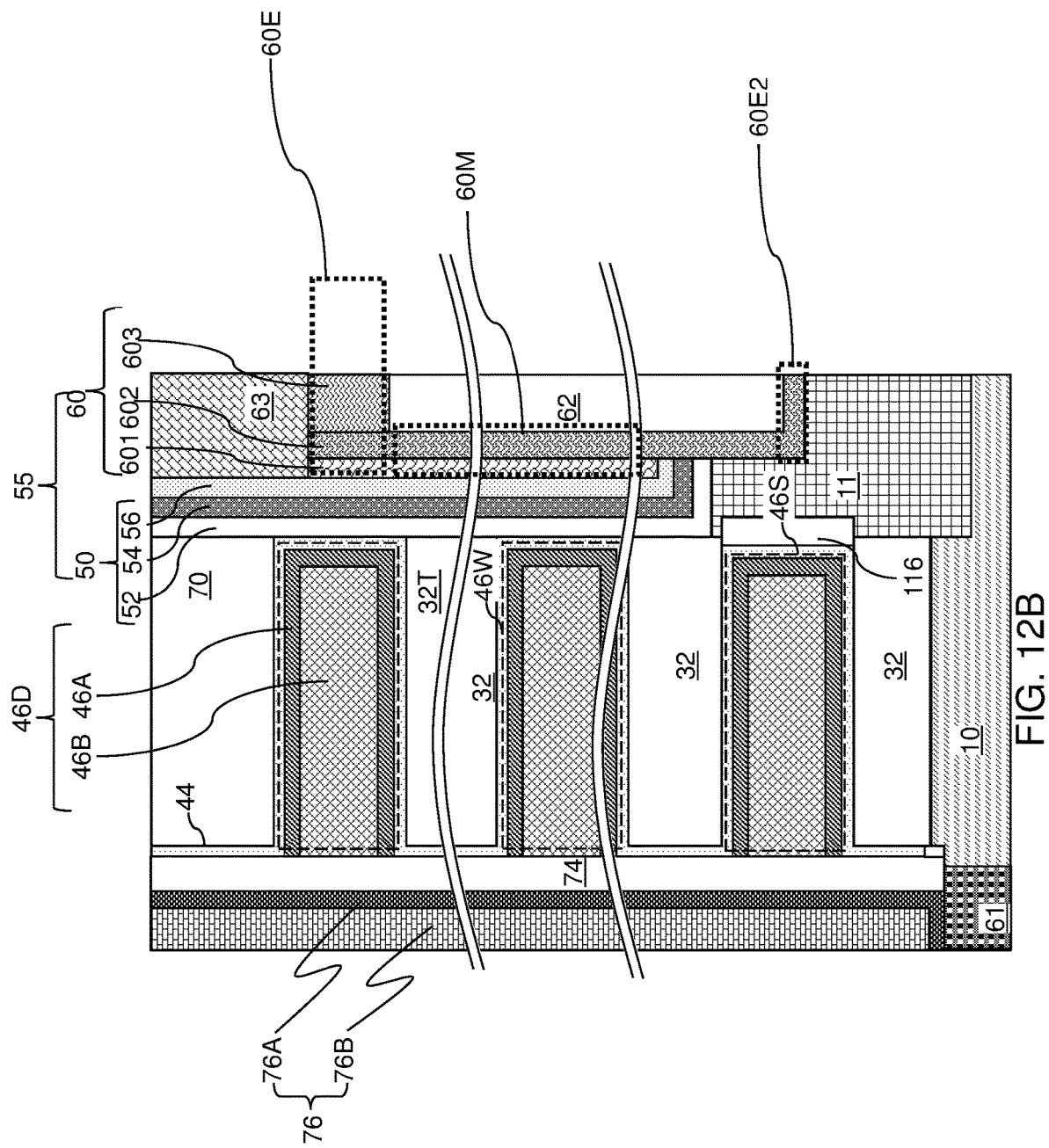
FIG. 12B is a magnified view of a region of the first exemplary structure of FIG. 12A.

Referring to FIGS. 12A and 12B, an insulating material layer can be formed in the backside trenches 79 and over the contact level dielectric layer 73 by a conformal deposition process. Exemplary conformal deposition processes include, but are not limited to, chemical vapor deposition and atomic layer deposition. The insulating material layer includes an insulating material such as silicon oxide, silicon nitride, a dielectric metal oxide, an organosilicate glass, or a combination thereof. In one embodiment, the insulating material layer can include silicon oxide. The insulating material layer can be formed, for example, by low pressure chemical vapor deposition (LPCVD) or atomic layer deposition (ALD). The thickness of the insulating material layer can be in a range from 1.5 nm to 60 nm, although lesser and greater thicknesses can also be employed.

If a backside blocking dielectric layer 44 is present, the insulating material layer can be formed directly on surfaces of the backside blocking dielectric layer 44 and directly on the sidewalls of the electrically conductive layers 46. If a backside blocking dielectric layer 44 is not employed, the insulating material layer can be formed directly on sidewalls of the insulating layers 32 and directly on sidewalls of the electrically conductive layers 46.

An anisotropic etch is performed to remove horizontal portions of the insulating material layer from above the contact level dielectric layer 73 and at the bottom of each backside trench 79. Each remaining portion of the insulating material layer constitutes an insulating spacer 74. A backside cavity 79' is present within a volume surrounded by each insulating spacer 74. A top surface of the semiconductor material layer 10 can be physically exposed at the bottom of each backside trench 79.

A substrate source region 61 can be formed at a surface portion of the semiconductor material layer 10 under each backside cavity 79' by implantation of electrical dopants into physically exposed surface portions of the semiconductor material layer 10. Each substrate source region 61 is formed in a surface portion of the substrate (9, 10) that underlies a respective opening through the insulating spacer 74. Due to the straggle of the implanted dopant atoms during the implantation process and lateral diffusion of the implanted dopant atoms during a subsequent activation anneal process, each substrate source region 61 can have a lateral extent greater than the lateral extent of the opening through the insulating spacer 74.

An upper region of the semiconductor material layer 10 that extends between the substrate source region 61 and the plurality of pedestal channel portions 11 constitutes a horizontal semiconductor channel 59 for a plurality of field effect transistors. The horizontal semiconductor channel 59 is connected to multiple vertical semiconductor channels 60 through respective pedestal channel portions 11. The horizontal semiconductor channel 59 contacts the substrate source region 61 and the plurality of pedestal channel portions 11. A bottommost electrically conductive layer 46 provided upon formation of the electrically conductive layers 46 within the alternating stack (32, 46) can comprise a select gate electrode for the field effect transistors. Each substrate source region 61 is formed in an upper region of the substrate (9, 10). Semiconductor channels (59, 11, 60) extend between each substrate source region 61 and a respective set of drain regions 63. The semiconductor channels (59, 11, 60) include the vertical semiconductor channels 60 of the memory stack structures 55.

A backside contact via structure 76 can be formed within each backside cavity 79'. Each contact via structure 76 can fill a respective backside cavity 79'. The contact via structures 76 can be formed by depositing at least one conductive material in the remaining unfilled volume (i.e., the backside cavity 79') of the backside trench 79. For example, the at least one conductive material can include a conductive liner 76A and a conductive fill material portion 76B. The conductive liner 76A can include a conductive metallic liner such as TiN, TaN, WN, TiC, TaC, WC, an alloy thereof, or a stack thereof. The thickness of the conductive liner 76A can be in a range from 3 nm to 30 nm, although lesser and greater thicknesses can also be employed. The conductive fill material portion 76B can include a metal or a metallic alloy. For example, the conductive fill material portion 76B can include W, Cu, Al, Co, Ru, Ni, an alloy thereof, or a stack thereof.

The at least one conductive material can be planarized employing the contact level dielectric layer 73 overlying the alternating stack (32, 46) as a stopping layer. If chemical mechanical planarization (CMP) process is employed, the contact level dielectric layer 73 can be employed as a CMP stopping layer. Each remaining continuous portion of the at least one conductive material in the backside trenches 79 constitutes a backside contact via structure 76.

The backside contact via structure 76 extends through the alternating stack (32, 46), and contacts a top surface of the substrate source region 61. If a backside blocking dielectric layer 44 is employed, the backside contact via structure 76 can contact a sidewall of the backside blocking dielectric layer 44.

Figure 13A:
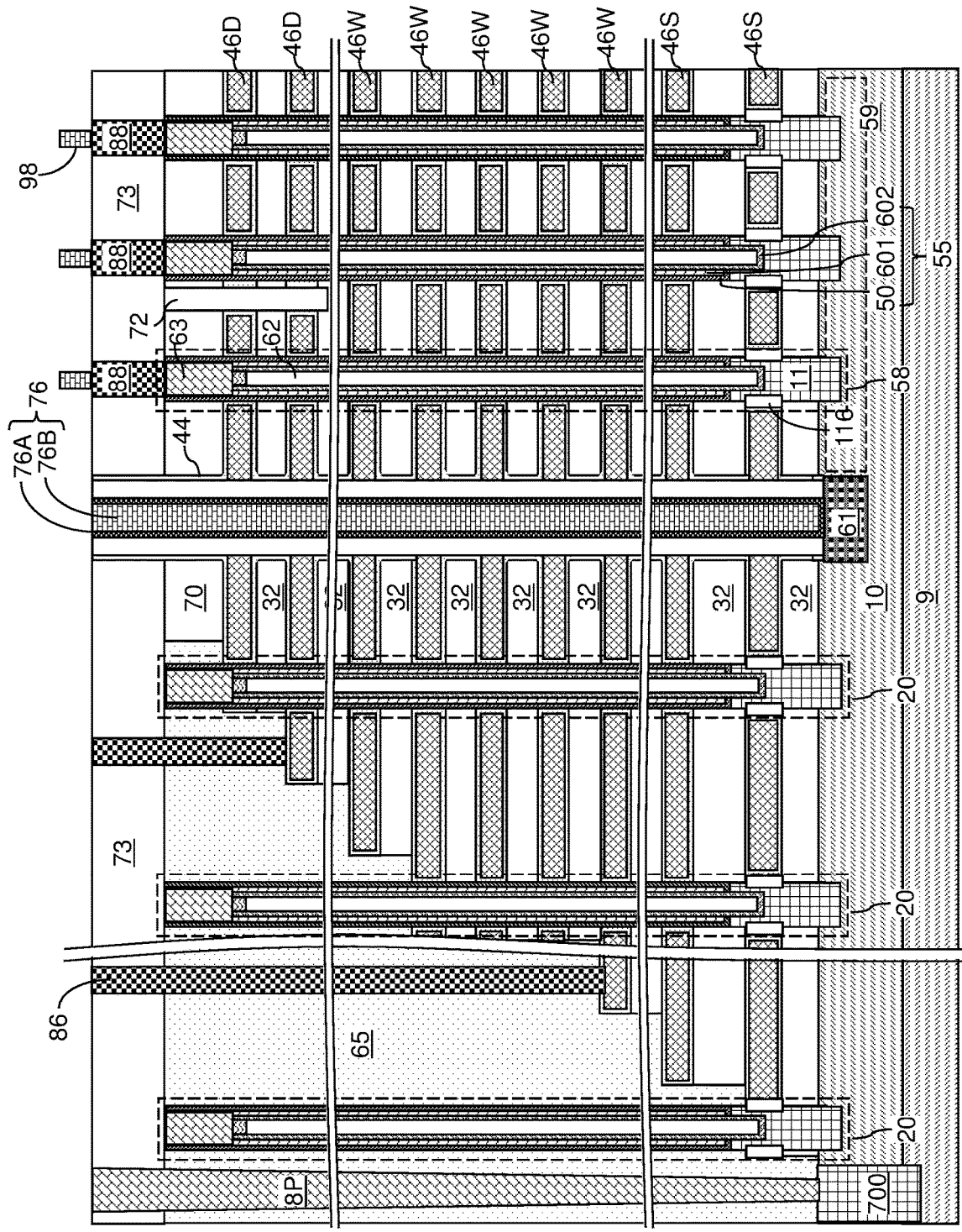
FIG. 13A is a schematic vertical cross-sectional view of the first exemplary structure after formation of additional contact via structures according to the first embodiment of the present disclosure.
Figure 13B:
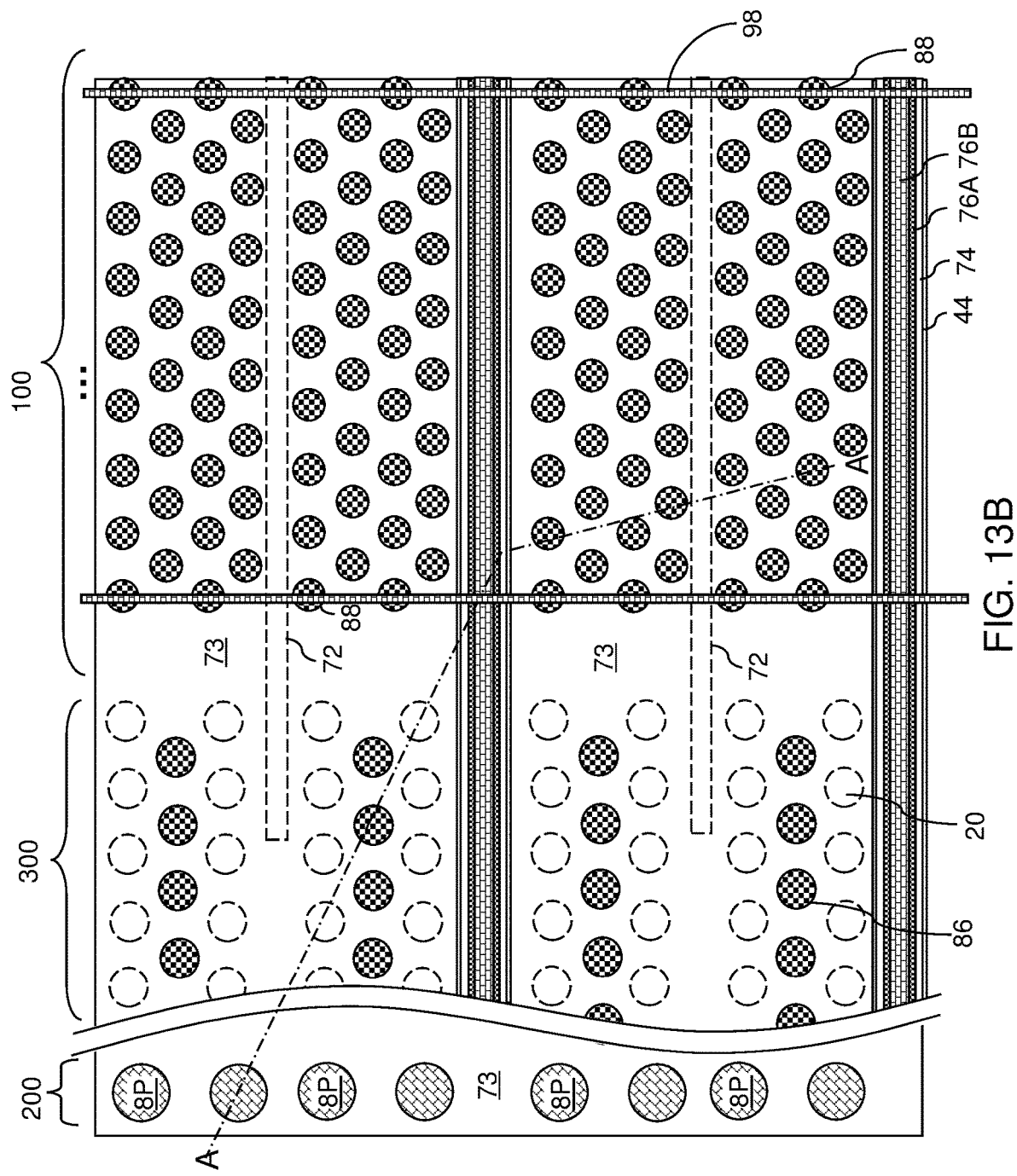
FIG. 13B is a top-down view of the first exemplary structure of FIG. 13A. The vertical plane A-A' is the plane of the schematic vertical cross-sectional view of FIG. 13A.

Referring to FIGS. 13A and 13B, additional contact via structures (88, 86, 8P) can be formed through the contact level dielectric layer 73, and optionally through the retro-stepped dielectric material portion 65. For example, drain contact via structures 88 can be formed through the contact level dielectric layer 73 on each drain region 63. Word line contact via structures 86 can be formed on the electrically conductive layers 46 (e.g., 46D, 46S and 46W) through the contact level dielectric layer 73, and through the retro-stepped dielectric material portion 65. Peripheral device contact via structures 8P can be formed through the retro-stepped dielectric material portion 65 directly on respective nodes of the peripheral devices (e.g., driver circuit devices) 700. Bit lines 98 are then formed in electrical contact with the drain contact via structures 88.

FIGS. 14A-14I are sequential schematic vertical cross-sectional views of a memory opening within the exemplary structure during formation of a second exemplary memory opening fill structure according to a second embodiment of the present disclosure. The second exemplary structure can be derived from the first exemplary structure by modifying components of each memory opening fill structure 58 and each support pillar structure 20.

Referring to FIG. 14A, a memory opening 49 in the second exemplary structure is illustrated at a processing step that corresponds to the processing step of FIG. 5A. The memory opening 49 of FIG. 14A can be the same as the memory opening illustrated in FIG. 5A.

Referring to FIG. 14B, a stack of layers including an optional blocking dielectric layer 52, a charge storage layer 54, a tunneling dielectric layer 56, and an optional first semiconductor channel layer 601 can be sequentially deposited in the memory openings 49. Each layer within the stack of layers (52, 54, 56, 601) can have the same material composition and the same thickness as in the first embodiment. The blocking dielectric layer 52, if present, can contact a top surface of semiconductor material layer 10 and sidewalls of the alternating stack (32, 42) around each memory opening 49 and around each support opening 19. Alternatively, the charge storage layer 54 may contact a top surface of semiconductor material layer 10 and sidewalls of the alternating stack (32, 42) around each memory opening 49 and around each support opening 19.

Referring to FIG. 14C, the optional first semiconductor channel layer 601, the tunneling dielectric layer 56, the charge storage layer 54, and the blocking dielectric layer 52 are sequentially anisotropically etched employing at least one anisotropic etch process. The portions of the first semiconductor channel layer 601, the tunneling dielectric layer 56, the charge storage layer 54, and the blocking dielectric layer 52 located above the top surface of the insulating cap layer 70 can be removed by the at least one anisotropic etch process. Further, the horizontal portions of the first semiconductor channel layer 601, the tunneling dielectric layer 56, the charge storage layer 54, and the blocking dielectric layer 52 at a bottom of each memory cavity 49' can be removed to form openings in remaining portions thereof. Each of the first semiconductor channel layer 601, the tunneling dielectric layer 56, the charge storage layer 54, and the blocking dielectric layer 52 can be etched by a respective anisotropic etch process employing a respective etch chemistry, which may, or may not, be the same for the various material layers.

Each remaining portion of the first semiconductor channel layer 601 can have a tubular configuration. The charge storage layer 54 can comprise a charge trapping material or a floating gate material. In one embodiment, each charge storage layer 54 can include a vertical stack of charge storage regions that store electrical charges upon programming. In one embodiment, the charge storage layer 54 can be a charge storage layer in which each portion adjacent to the sacrificial material layers 42 constitutes a charge storage region. A surface of the semiconductor material layer 10 can be physically exposed underneath the opening through the first semiconductor channel layer 601, the tunneling dielectric layer 56, the charge storage layer 54, and the blocking dielectric layer 52. In one embodiment, the first semiconductor channel layer 601, the tunneling dielectric layer 56, the charge storage layer 54, and the blocking dielectric layer 52 can have vertically coincident sidewalls.

Referring to FIG. 14D, a semiconductor fill material can be anisotropically or selectively deposited into each memory opening 49, into each support opening 19, and optionally over the insulating cap layer 70 to form semiconductor material portions. The semiconductor fill material may include an elemental semiconductor material (such as silicon or germanium) or a compound semiconductor material. For example, the semiconductor fill material can include doped polysilicon or doped amorphous silicon. The atomic concentration of dopants of the first conductivity type in the semiconductor fill material can be in a range from $1.0 \times 10^{14}/cm^3$ to $1.0 \times 10^{18}/cm^3$, although lesser and greater dopant concentrations can also be employed. The semiconductor fill material can be deposited by anisotropic physical vapor deposition (sputtering) or by non-conformal chemical vapor deposition such as plasma-enhanced chemical vapor deposition (PECVD) or by selective chemical vapor deposition on the semiconductor material layer 10 if the first semiconductor channel layer 601 is removed. Optionally, an isotropic etch back process (such as a wet etch process) may be performed to remove portions of the anisotropically deposited semiconductor fill material that are deposited on sidewalls of the first semiconductor channel layer 601.

Each portion of the semiconductor fill material formed at the bottom of each memory opening 49 or at the bottom of each support opening 19 constitutes a channel pillar portion 604. Each channel pillar portion 604 can be formed at the bottom end of a memory opening 49 or at the bottom end of a support opening 19 after formation of the verticals stack of memory elements and after formation of the tunneling dielectric layer 56. Each channel pillar portion 604 extends through an opening in a horizontal bottom portion of a layer stack (52, 54, 56, 601) including at least the blocking dielectric layer 52, the charge storage layer 54, the tunneling dielectric layer 56, and optionally the first semiconductor channel layer 601. The top surface of each channel pillar portion 604 can protrude above the top surface of the horizontal bottom portion of a respective tunneling dielectric layer 56. In one embodiment, each channel pillar portion 604 can have a sidewall that contacts a sidewall of a respective first semiconductor channel layer 601 (if present).

The height of the channel pillar portions 604 can be selected such that the top surface of each channel pillar portion 604 is formed between a first horizontal plane including the top surface of the bottommost one of the spacer material layers (such as the top surface of the bottommost sacrificial material layer 42B) and a second horizontal plane including the bottom surface of the bottommost one of the spacer material layers (such as the bottom surface of the bottommost sacrificial material layer 42B). As discussed above, in the case of an alternating stack including the insulating layers 32 and spacer material layers (such as the sacrificial material layers 42), a terminal spacer material layer can a topmost spacer material layer (such as the topmost sacrificial material layer 42T) and/or a bottommost spacer material layer (such as the bottommost sacrificial material layer 42B). Thus, the top surface of each channel pillar portion 604 can be formed between a first horizontal plane including the top surface of the terminal spacer material layer (such as the top surface of the bottommost sacrificial material layer 42B) and a second horizontal plane including the bottom surface of the terminal spacer material layer (such as the bottom surface of the bottommost sacrificial material layer 42B). Each portion of the semiconductor fill material (if present) formed on the top surface of the insulating cap layer 70 constitutes a semiconductor cap layer 604', which may include as many number of openings therethrough as the total number of the memory openings 49 and the support openings 19.

In an alternative embodiment which uses selective deposition, the first semiconductor channel layer 601 (if initially present) can be removed by an isotropic etch process selective to the material of the tunneling dielectric layer 56. For example, a wet etch process using hot trimethyl-2 hydroxyethyl ammonium hydroxide ("hot TMY") or tetramethyl ammonium hydroxide (TMAH) may be used to remove the first semiconductor channel layer 601. A selective semiconductor deposition process can be subsequently performed to grow a semiconductor fill material from the physically exposed surfaces of the semiconductor material layer 10. The selective semiconductor deposition process is a semiconductor material deposition process that flows a semiconductor precursor gas and an etchant gas simultaneously or alternately to suppress growth of a semiconductor material from dielectric surfaces, while enabling growth of the semiconductor material from physically exposed semiconductor surfaces. The difference in nucleation time between semiconductor surfaces and insulating surfaces is utilized to prevent growth of the semiconductor fill material from the physically exposed surfaces of the tunneling dielectric layer 56, the blocking dielectric layer 52, and the insulating cap layer 70, while enabling growth of the semiconductor fill material from the physically exposed surfaces of the semiconductor material layer 10. The selectively deposited semiconductor fill material can form a channel pillar portion 604 at the bottom of each memory opening 49 and at the bottom of each support opening 19. In this case, the semiconductor fill material is not deposited over the insulating cap layer 70, and thus, a semiconductor cap layer 604' is not formed over the insulating cap layer 70.

Referring to FIG. 14E, dopants of the second conductivity type can be introduced into the channel pillar portion 604, for example, by an ion implantation process. The dose and the implantation depth of the ion implantation process can be selected so that at least an upper region of the channel pillar portion 604 is converted into an active region having a net doping of the second conductivity type. The active region may be a source region or a drain region. In case vertical semiconductor channels are subsequently formed in the memory openings 49 and bit lines are subsequently connected to an upper end of a respective vertical semiconductor channel, the active region at the bottom of each memory opening 49 can be a pillar source region 605. In this case, a pillar source region 605 can be formed in a bottom region of each memory opening 49 and in a bottom region of each support opening 19.

The net dopant concentration of the dopants of the second conductivity type of each pillar source region 605 can be in a range from $5.0\times10^{19}/cm^3$ to $2.0\times10^{21}/cm^3$, although lesser and greater dopant concentrations can also be employed. The dopant may comprise one or both of arsenic and phosphorus. Generally, the active regions (such as the source regions 603) can be formed by implanting dopants of the second conductivity type into an upper region of the channel pillar portion 604 in the memory openings 49, thereby converting at least an upper region of each channel pillar portion 604 into a pillar source region 605. In one embodiment, an unimplanted portion of a channel pillar portion 604 is present underneath each pillar source region 605. In another embodiment, the entirety of each channel pillar portion 604 can be converted into the pillar source region 605. At least an upper region of the semiconductor cap layer 604' (if present) can be converted into a second-conductivity-type semiconductor material layer 605' having a doping of the second conductivity type by the ion implantation process.

In an alternative embodiment in which the first semiconductor channel layer 601 is removed by an isotropic etch process selective to the material of the tunneling dielectric layer 56, and selective deposition of a semiconductor fill material forms a channel pillar portion 604 at the bottom of each memory opening 49 and at the bottom of each support opening 19, the ion implantation process can covert at least the upper region of each channel pillar portion 604 into a respective pillar source region 605. Yet alternately, the first semiconductor channel layer 601 is removed by an isotropic etch process selective to the material of the tunneling dielectric layer 56, and selective deposition of a semiconductor fill material can be performed with in-situ doping with dopants of the second conductivity type. In this case, a pillar source region 605 can be formed in lieu of each channel pillar portion 604 after the processing steps of FIG. 14D, and the ion implantation process at the processing steps of FIG. 14E is optional.

In case the first semiconductor channel layer 601 is present during the ion implantation process that forms the pillar source regions 605, the first semiconductor channel layer 601 may be subsequently removed selective to the material of the pillar source regions 605. In this case, an isotropic etchant such as TMY or TMAH may be employed to remove the first semiconductor channel layer 601 selective to the pillar source regions 605. The high dopant concentration in the pillar source regions 605 can reduce the etch rate of the semiconductor material of the pillar source regions 605 relative to the etch rate of the semiconductor material of the first semiconductor channel layer 601.

Referring to FIG. 14F, a second semiconductor channel layer 602 can be conformally deposited directly on the top surface of each pillar source region 605 and on physically exposed inner sidewalls of first semiconductor channel layer 601, if present, or on physically exposed inner sidewalls of the tunneling dielectric layers 56 (if the first semiconductor channel layer 601 is removed in a previous processing step). If a second-conductivity-type semiconductor material layer 605' is present, the second semiconductor channel layer 602 can be formed over the second-conductivity-type semiconductor material layer 605'. The second semiconductor channel layer 602 includes a semiconductor material such as at least one elemental semiconductor material, at least one III-V compound semiconductor material, at least one II-VI compound semiconductor material, at least one organic semiconductor material, or other semiconductor materials known in the art. In one embodiment, the second semiconductor channel layer 602 includes amorphous silicon or polysilicon. The second semiconductor channel layer 602 can be formed by a conformal deposition method such as low pressure chemical vapor deposition (LPCVD). The atomic concentration of dopants of the first conductivity type in the second semiconductor channel layer 602 can be in a range from $1.0 \times 10^{14}/cm^3$ to $1.0 \times 10^{18}/cm^3$, although lesser and greater dopant concentrations can also be employed. The thickness of the second semiconductor channel layer 602 can be in a range from 2 nm to 10 nm, although lesser and greater thicknesses can also be employed. The second semiconductor channel layer 602 may partially fill the memory cavity 49' in each memory opening, or may fully fill the cavity in each memory opening.

The combination of the first semiconductor channel layer 601 and the second semiconductor channel layer 602 is herein referred to as a semiconductor channel material layer (601, 602). The semiconductor channel material layer (601, 602) has a doping of the first conductivity type, and is formed over the vertical stack of memory elements. The average atomic concentration of dopants of the first conductivity type in the semiconductor channel material layer (601, 602) can be in a range from $1.0 \times 10^{14}/cm^3$ to $1.0 \times 10^{18}/cm^3$, although lesser and greater dopant concentrations can also be employed.

Referring to FIG. 14G, the processing steps of FIGS. 5F and 5G can be performed to form a dielectric core within each of the memory openings 49 and the support openings 19. In this case, the material of the dielectric core layer 62L can be vertically recessed selective to the semiconductor material of the second semiconductor channel layer 602 into each memory opening 49 down to a depth between a first horizontal plane including the top surface of the topmost one of the spacer material layers (such as the top surface of the topmost sacrificial material layer 42T) and a second horizontal plane including the top surface of the second topmost one of the spacer material layers (such as the top surface of the second sacrificial material layer 42S as counted from the top). Each remaining portion of the dielectric core layer 62L constitutes a dielectric core 62.

Generally, the dielectric core 62 can be formed within a cavity located inside the semiconductor channel material layer (601, 602) by depositing and recessing the dielectric core material. The dielectric core 62 is formed on an inner sidewall of the material of the semiconductor channel material layer (601, 602).

In one embodiment, the top surface of each dielectric core 62 can be located between the horizontal plane including the top surface of the topmost sacrificial material layer 42T and the bottom surface of the topmost sacrificial material layer 42T. In another embodiment, the top surface of each dielectric core 62 can be located between the horizontal plane including the top surface of the topmost insulating layer 32T (which contacts the bottom surface of the topmost sacrificial material layer 42T) and the horizontal plane including the bottom surface of the topmost insulating layer 32T (which contacts the top surface of the second topmost sacrificial material layer 42S). Alternatively, the top surface of each dielectric core 62 may be in the same horizontal plane as the bottom surface of the topmost sacrificial material layer 42T.

Referring to FIG. 14H, the steps shown in FIG. 5H are performed to deposit a semiconductor fill material having a doping of the first conductivity type in each unfilled volume of the memory openings 49 and the support openings 19. The semiconductor fill material of the second embodiment may be the same as the semiconductor fill material of the first embodiment. The portions of the semiconductor fill material, the second semiconductor channel layer 602, the optional second-conductivity-type semiconductor material layer 605', and the optional semiconductor cap layer 604' located above the horizontal plane including the top surface of the insulating cap layer 70 can be removed by a planarization process, which can employ a recess etch or chemical mechanical planarization (CMP). The planarization process can employ the top surface of the insulating layer 70 as a stopping surface.

The remaining portions of the second semiconductor channel layer 602 and the semiconductor fill material within each memory opening 49 or within each support opening 19 can have top surfaces locate at, or about, the horizontal plane including the top surface of the insulating cap layer 70. Each remaining portion of the semiconductor fill material constitutes a channel cap portion 603. The channel cap portion 603 contacts an inner sidewall of the semiconductor channel material layer (601, 602) and a top surface of a dielectric core 62. Each contiguous combination of a semiconductor channel material layer (601, 602) and a channel cap portion 603 constitutes a vertical semiconductor channel 60. The materials of the first semiconductor channel layer 601, the second semiconductor channel layer 602, and the channel cap portion 603 are collectively referred to as a semiconductor channel material. Each channel cap portion 603 is formed on a top surface of a dielectric core 62.

Referring to FIG. 14I, the processing steps of FIG. 5I can be performed to form a memory opening fill structure 58 within each memory opening 49 and to form a support pillar structure 20 within each support opening 19. The memory opening fill structure 58 illustrated in FIG. 14I is a second exemplary memory opening fill structure. The first exemplary memory opening fill structure of the first embodiment includes a pedestal channel portion 11 that underlies a memory film 50. The second exemplary memory opening fill structure of the second embodiment includes a pillar source region 605 and an optional channel pillar portion 604 that extend through a bottom horizontal portion of a memory film 50. In each case, the vertical semiconductor channel 60 includes a second semiconductor channel layer 602 and a channel cap portion 603, and may optionally include a first semiconductor channel layer 601. The area of the p-n junction can be the same as the area of the bottom surface of the drain region 63, and can be the same as the area of the top surface of the vertical semiconductor channel 60.

Each adjoining set of the optional first semiconductor channel layer 601, the second semiconductor channel layer 602, and the channel cap portion 603 constitutes a vertical semiconductor channel 60 through which electrical current can flow when a vertical NAND device including the vertical semiconductor channel 60 is turned on. Each combination of a memory film 50 and a vertical semiconductor channel 60 within a memory opening 49 constitutes a memory stack structure 55. The memory stack structure 55 is a combination of a semiconductor channel 60, a tunneling dielectric layer 56, a plurality of memory elements as embodied as portions of the charge storage layer 54, and a blocking dielectric layer 52. Each combination of a channel pillar portion 604 (if present), a pillar source region 605, a memory stack structure 55, a dielectric core 62, and a drain region 63 within a memory opening 49 constitutes a memory opening fill structure 58. Each combination of a channel pillar portion 604 (if present), a pillar source region 605, a memory stack structure 55, a dielectric core 62, and a drain region 63 within a support opening 19 constitutes a support pillar structure.

Subsequently, as shown in FIG. 14J, the processing steps of FIGS. 7A-13B can be performed in the same manner as in the first embodiment. The sacrificial material layers 42 are replaced with the electrically conductive layers 46 (i.e., 46D, 46S and 46W).

Figure 15:
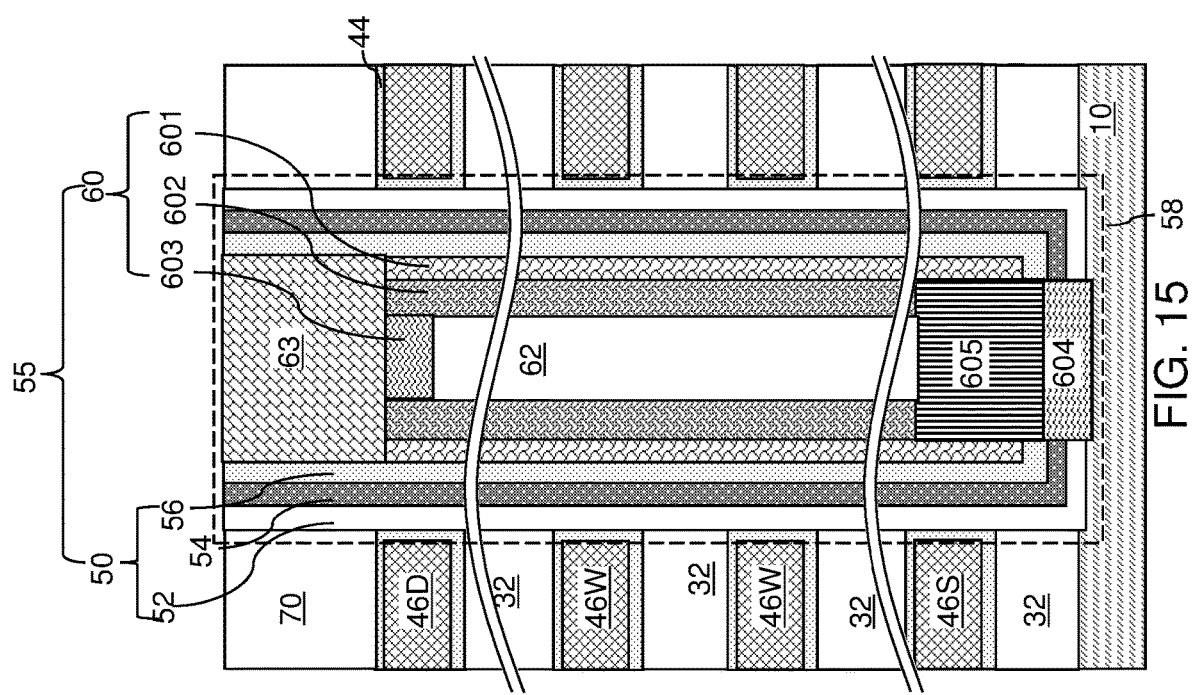
FIG. 15 is a vertical cross-sectional view of the second exemplary memory opening fill structure after formation of the electrically conductive layers according to the second embodiment of the present disclosure.

Referring to FIG. 15, a second exemplary memory opening fill structure in the second exemplary structure of the second embodiment is illustrated after formation of electrically conductive layers 46 (i.e., 46D, 46S, 46W). In this alternative structure, the horizontal portion of the semiconductor channel 60 (i.e., the horizontal portion of the second semiconductor channel layer 602) located above the pillar source region 605 is omitted. The pillar source region 605 contacts the hollow vertical portions of the semiconductor channel 60.

A first p-n junction can be formed within a horizontal plane including an interface between the vertical semiconductor channel 60 and the pillar source region 605. The horizontal plane can be located between the top and bottom surfaces of a bottommost source select gate electrode 46S. In the second embodiment, the topmost drain select gate electrode 46D may overlap with the drain region 63 as in the first embodiment, or the entire topmost drain select gate electrode 46D may be located below the drain region 63 (i.e., below the horizontal plane of the bottom of the drain region 63).

Figure 16:
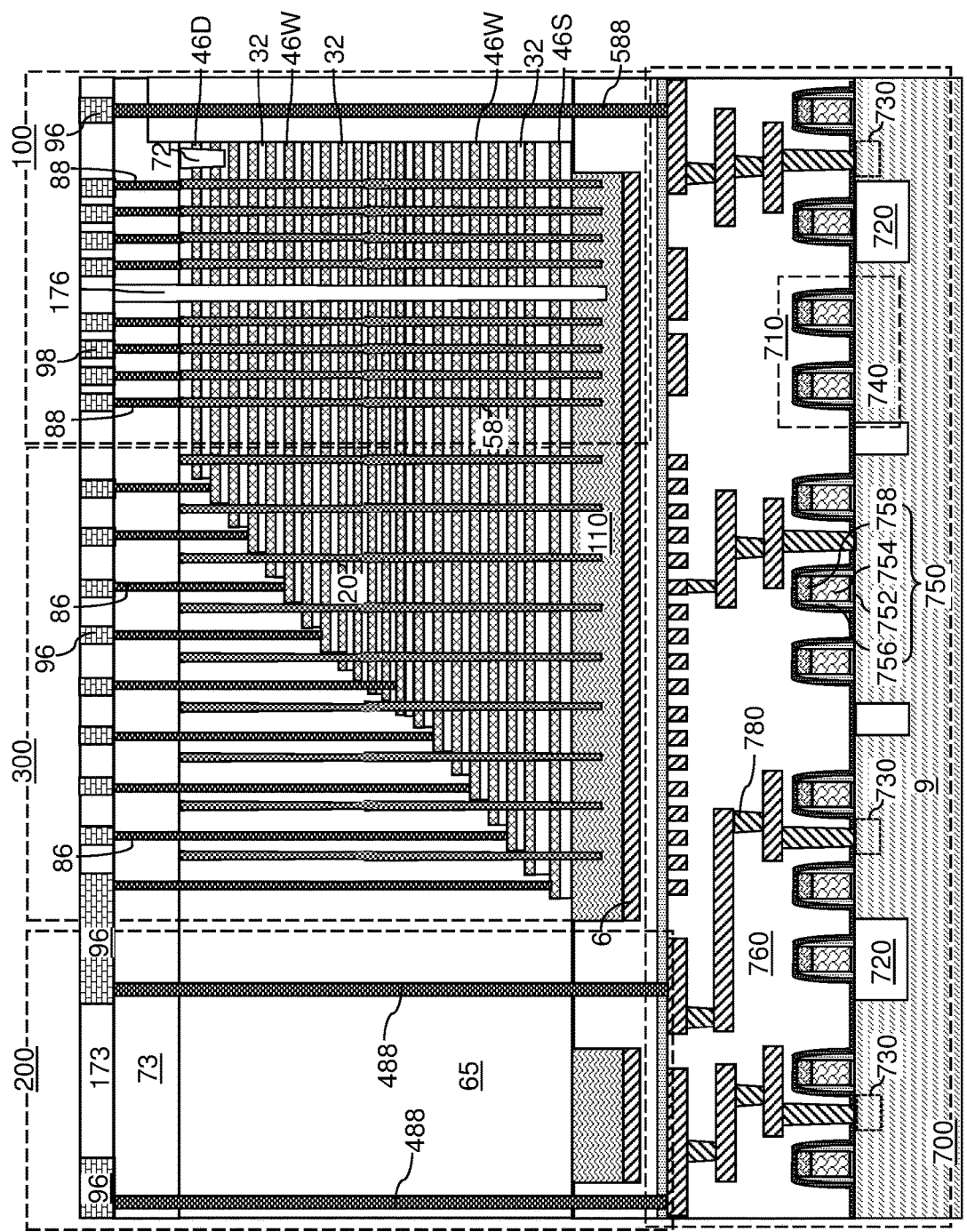
FIG. 16 is a schematic vertical cross-sectional view of an alternative exemplary structure in a CMOS under array configuration.

As described above, in one configuration, the peripheral semiconductor devices 700 may be located next to the memory array region 100, as shown in FIGS. 1 and 13A. In another configuration, the peripheral semiconductor devices 700 of the first or the second embodiment may be located under the memory array region 100 in a CMOS under array ("CUA") configuration, as shown in FIG. 16. In this configuration, the word lines 46W and the memory opening fill structures 58 are located above the peripheral semiconductor devices 700.

As shown in FIG. 16, the peripheral semiconductor devices 700 include driver circuit transistors 710 including a gate electrode structure 750, active regions 730 (i.e., source and drain regions) a semiconductor channel 740 located below the gate electrode structure 750. The peripheral semiconductor devices 700 also include lower-level dielectric material layers 760 and the lower-level metal interconnect structures 780 electrically connected to the nodes (e.g., gate electrode structures 750 and/or active regions 730) of the driver circuit transistors (e.g., CMOS type transistors) 710.

Peripheral-region contact via structures 488 in region 200 and/or through-memory-region via structures 588 in region 100 are formed in electrical contact with the lower-level metal interconnect structures 780. Interconnection line structures 96 and bit lines 98 are formed in interconnection level dielectric layer 173. The interconnection line structures 96 electrically connect the contact via structures 86 to the peripheral-region contact via structures 488 and/or the through-memory-region via structures 588. Furthermore, in this embodiment, a dielectric wall structure 176 may be formed in the backside trench 79 instead of the backside contact via structure 76. Still further, instead of the source region 61, a horizontal source line 110 may contact exposed sidewalls of the vertical semiconductor channels 60 in the memory opening fill structures. The horizontal source line 110 may include one or more doped polysilicon layers. An optional conductive plate 6, such as a metal or metal silicide plate, may be located in contact with the horizontal source line 110 for improved conductivity.

Referring to all drawings and according to various embodiments of the present disclosure, a three-dimensional memory device is provided, which comprises: an alternating stack of insulating layers 32 and electrically conductive layers 46 located over a substrate (9, 10), wherein the electrically conductive layers 46 comprise word lines 46W located between a source select gate electrode 46S and a drain select gate electrode 46D; a memory opening 49 vertically extending through each layer of the alternating stack (32, 46) to a top surface of the substrate (9, 10); a memory film 50 and vertical semiconductor channel 60 having a doping of a first conductivity type located in the memory opening 49; and an active region (605, 63) having a doping of a second conductivity type that is an opposite of the first conductivity type and adjoined to an end portion 60E of the vertical semiconductor channel 60 to provide a p-n junction. As shown in FIGS. SI, 12B and 14J, the end portion 60E of the vertical semiconductor channel 60 has a first thickness T1, and a middle portion 60M of the vertical semiconductor channel 60 has a second thickness T2 which is less than the first thickness T1.

In one embodiment, the three-dimensional memory device comprises a dielectric core 62. The middle portion 60M of the vertical semiconductor channel 60 comprises a tubular portion which laterally surrounds the dielectric core 62.

In one embodiment, the dielectric core 62 does not directly contact the active region 63, and is vertically spaced from the active region 63 by the end portion 60E of the vertical semiconductor channel 60. In one embodiment, an area of the p-n junction is the same as an area within a periphery of the end portion 60E of the vertical semiconductor channel 60.

In one embodiment, the middle portion 60M of the semiconductor channel 60 is located at levels of the word lines 46W between the first end portion 60E and a second end portion 60E2 of the semiconductor channel 60, as shown in FIGS. 12B and 14J.

In one embodiment shown in FIG. 14J, the active region is a source region 605, the end portion of the vertical semiconductor channel comprises the second end portion 60E2 located at a level of the source select electrode 46S, and the p-n junction is located within a horizontal plane which is located between top and bottom surfaces of the source select gate electrode 46S.

In another embodiment shown in FIGS. 12B, 14J and 15, the active region is a drain region 63, the end portion of the vertical semiconductor channel 60 comprises the first end portion 60E located at a level of the drain select electrode 46D, and the p-n junction is located within a horizontal plane which is located between top and bottom surfaces of the drain select gate electrode 46D.

In one embodiment shown in FIGS. 14J and 15, the three-dimensional memory device comprises a source region 605 having a doping of the second conductivity type in addition to the drain region 63. The source region 605 is adjoined to the second end portion 60E2 of the vertical semiconductor channel 60 to provide an additional p-n junction located within an additional horizontal plane, which is located between top and bottom surfaces of the source select gate electrode 46S.

In one embodiment shown in FIG. 15, the dielectric core 62 contacts a center portion of a surface of the additional active region 605, and the vertical semiconductor channel 60 contacts a peripheral portion of the surface of the additional active region 605. In another embodiment shown in FIG. 14J, the second end portion 60E2 of the semiconductor channel 60 is thicker than the middle portion of the semiconductor channel 60M, and the dielectric core 62 does not directly contact the source region 605, and is vertically spaced from the source region by the second end portion 60E2 of the vertical semiconductor channel 60.

In one embodiment, the memory film 50 comprises a tunneling dielectric layer 56 that laterally surrounds the vertical semiconductor channel 60, and a charge storage layer 54 located within the memory opening 49 and which laterally surrounds the tunneling dielectric layer 56.

In one embodiment, the alternating stack (32, 46) comprises a terrace region in which each electrically conductive layer 46 other than a topmost electrically conductive layer 46 within the alternating stack (32, 46) laterally extends farther than any overlying electrically conductive layer 46 within the alternating stack (32, 46); the terrace region includes stepped surfaces of the alternating stack (32, 46) that continuously extend from a bottommost layer within the alternating stack (32, 46) to a topmost layer within the alternating stack (32, 46); and support pillar structures 20 extend through the stepped surfaces and through a retro-stepped dielectric material portion 65 that overlies the stepped surfaces.

The exemplary structures can include a three-dimensional memory device. In one embodiment, the three-dimensional memory device comprises a monolithic three-dimensional NAND memory device. The electrically conductive layers 46 can comprise, or can be electrically connected to, a respective word line 46W of the monolithic three-dimensional NAND memory device. The substrate (9, 10) can comprise a silicon substrate. The vertical NAND memory device can comprise an array of monolithic three-dimensional NAND strings over the silicon substrate. At least one memory cell (comprising a portion of a charge storage layer 54 at a level of an electrically conductive layer 46) in a first device level of the array of monolithic three-dimensional NAND strings can be located over another memory cell (comprising another portion of the charge storage layer 54 at a level of another electrically conductive layer 46) in a second device level of the array of monolithic three-dimensional NAND strings. The silicon substrate can contain an integrated circuit comprising a driver circuit (comprising semiconductor devices 700) for the memory device located thereon. The electrically conductive layers 46 can comprise a plurality of control gate electrodes having a strip shape extending substantially parallel to the top surface of the substrate (9, 10), e.g., between a pair of backside trenches 79. The plurality of control gate electrodes comprises at least a first control gate electrode (e.g., portion of a first word line 46W) located in a first device level and a second control gate electrode (e.g., portion of a second word line 46W) located in a second device level. The array of monolithic three-dimensional NAND strings can comprise a plurality of semiconductor channels (59, 11, 604, 60) and a plurality of charge storage elements (as embodied as portions of the memory films 50, i.e., portions of the charge storage layer 54). Each charge storage element can be located adjacent to a respective one of the plurality of semiconductor channels (59, 11, 604, 60).

An erase operation in a vertical NAND string applies a high voltage in a vertical semiconductor channel 60. Gate-induced leakage current (such as gate-induced drain leakage or a source-side equivalent thereof) may be used to generate holes to be injected into the vertical stack of charge storage elements during the erase operation. Reverse bias breakdown occurs at a p-n junction during generation of such gate-induced leakage current. The various embodiments of the present disclosure provide a thicker end portion of the semiconductor channel and p-n junction having a same horizontal cross-sectional area as the entire area that is laterally enclosed by a tunneling dielectric layer at an interface between a drain region or a source region and a vertical semiconductor channel. The increased thickness of the end portion of the channel and the increased area of the p-n junction provides enhancement in the gate-induced leakage current compared to prior art structures in which a drain region contacts a dielectric core and which lacks the thicker end portion of the semiconductor channel. Further, the p-n junction can be located below the horizontal plane including the top surface of a topmost drain select gate electrode. The overlap between the drain region and the drain select gate electrode enhances the electrical field that induces the gate-induced leakage current. Further, an additional p-n junction can be provided on the source side at the bottom of a vertical semiconductor channel above the bottom surface of the source select gate electrode. In this case, the additional thicker end portion of the semiconductor channel and the additional p-n junction can provide additional leakage current during the erase operation. Thus, the various embodiments of the present disclosure can provide an increased electron-hole pair generation and higher speed GIDL erase operation for a three-dimensional NAND memory device. Furthermore, the thicker end portion of the polysilicon channel located under the topmost drain select gate electrode may enhance a peak field and therefore provide stronger GIDL generation. The thicker polysilicon channel may also provide a "floating body" on the source side of drain select gate transistor channel which receives holes and threshold voltage drops. This lowered threshold voltage assists electrons (if any, for example residual electrons in the channel) to flow out of the channel and improves channel electrical potential for better erase.

Although the foregoing refers to particular preferred embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment employing a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:
1. A three-dimensional memory device, comprising:
an alternating stack of insulating layers and electrically conductive layers located over a substrate, wherein the electrically conductive layers comprise word lines located between a source select gate electrode and a drain select gate electrode;
a memory opening vertically extending through each layer of the alternating stack to a top surface of the substrate;

a memory film and vertical semiconductor channel having a doping of a first conductivity type located in the memory opening;

an active region having a doping of a second conductivity type that is an opposite of the first conductivity type and adjoined to an end portion of the vertical semiconductor channel to provide a p-n junction, wherein the end portion of the vertical semiconductor channel has a first thickness, and a middle portion of the vertical semiconductor channel has a second thickness which is less than the first thickness; and a dielectric core, wherein:

the middle portion of the vertical semiconductor channel comprises a tubular portion which laterally surrounds the dielectric core;

the dielectric core does not directly contact the active region, and is vertically spaced from the active region by the end portion of the vertical semiconductor channel;

an area of the p-n junction is the same as an area within the end portion of the vertical semiconductor channel;

the middle portion of the semiconductor channel is located at levels of the word lines between first and second end portions of the semiconductor channel;

the active region is a source region;

the end portion of the vertical semiconductor channel comprises the second end portion located at a level of the source select electrode; and the p-n junction is located within a horizontal plane which is located between top and bottom surfaces of the source select gate electrode.

2. A three-dimensional memory device, comprising:

an alternating stack of insulating layers and electrically conductive layers located over a substrate, wherein the electrically conductive layers comprise word lines located between a source select gate electrode and a drain select gate electrode;

a memory opening vertically extending through each layer of the alternating stack to a top surface of the substrate;

a memory film and vertical semiconductor channel having a doping of a first conductivity type located in the memory opening;

an active region having a doping of a second conductivity type that is an opposite of the first conductivity type and adjoined to an end portion of the vertical semiconductor channel to provide a p-n junction, wherein the end portion of the vertical semiconductor channel has a first thickness, and a middle portion of the vertical semiconductor channel has a second thickness which is less than the first thickness;

a dielectric core, wherein:

the middle portion of the vertical semiconductor channel comprises a tubular portion which laterally surrounds the dielectric core;

the dielectric core does not directly contact the active region, and is vertically spaced from the active region by the end portion of the vertical semiconductor channel;

an area of the p-n junction is the same as an area within the end portion of the vertical semiconductor channel;

the middle portion of the semiconductor channel is located at levels of the word lines between first and second end portions of the semiconductor channel;

the active region is a drain region;

the end portion of the vertical semiconductor channel comprises the first end portion located at a level of the drain select electrode; and the p-n junction is located within a horizontal plane which is located between top and bottom surfaces of the drain select gate electrode; and a source region having a doping of the second conductivity type and adjoined to the second end portion of the vertical semiconductor channel to provide an additional p-n junction located within an additional horizontal plane which is located between top and bottom surfaces of the source select gate electrode.

3. The three-dimensional memory device of claim 2, wherein the dielectric core contacts a center portion of a surface of the source region, and the vertical semiconductor channel contacts a peripheral portion of the surface of the source region.

4. The three-dimensional memory device of claim 2, wherein:

the second end portion of the semiconductor channel is thicker than the middle portion of the semiconductor channel; and the dielectric core does not directly contact the source region, and is vertically spaced from the source region by the second end portion of the vertical semiconductor channel.

* * * * *